United States Patent [19]
Bangham

[11] Patent Number: 5,917,733
[45] Date of Patent: *Jun. 29, 1999

[54] PULSE ANALYSIS USING ORDINAL VALUE FILTERING

[75] Inventor: James Andrew Bangham, Norwich, United Kingdom

[73] Assignee: Cambridge Consultants Limited, Cambridge, United Kingdom

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/492,031
[22] PCT Filed: Jan. 14, 1994
[86] PCT No.: PCT/GB94/00080
  § 371 Date: Jun. 30, 1995
  § 102(e) Date: Jun. 30, 1995
[87] PCT Pub. No.: WO94/16499
  PCT Pub. Date: Jul. 21, 1994

[30] Foreign Application Priority Data

Jan. 16, 1993 [GB] United Kingdom .................... 9300782
Nov. 6, 1993 [GB] United Kingdom .................... 9322918

[51] Int. Cl.$^6$ ............................................. G06F 17/10
[52] U.S. Cl. ................................ 364/724.011; 382/218; 382/262
[58] Field of Search ................. 364/724.01, 724.16, 364/724.17, 715.06; 382/262, 218

[56] References Cited

U.S. PATENT DOCUMENTS

| | | | |
|---|---|---|---|
| 4,603,430 | 7/1986 | Sacks | 382/262 |
| 4,713,786 | 12/1987 | Roskind | 364/715.06 |
| 4,970,637 | 11/1990 | Sato | 364/715.06 |
| 5,097,433 | 3/1992 | Caracciolo | 364/724.01 |
| 5,319,583 | 6/1994 | Wildes | 364/724.01 |

*Primary Examiner*—David H. Malzahn
*Attorney, Agent, or Firm*—Lee, Mann, Smith, McWilliams, Sweeney & Ohlson

[57] ABSTRACT

An image and pulse analysis system and method including a datasieve comprising a succession of ordinal filtering means receiving at least a selected part of a signal conglomerate and filtering the at least a selected part of the signal conglomerate to produce a bandpass filter output, the ordinal filtering means having window lengths increasing from N (less than M) up to M, whereby an input signal to each successive filtering means is formed from the output of the previous filtering means; selection means for selecting a predetermined subset of bandpass filter outputs from outputs of the succession of filtering means; and arithmetic means for adding together the signals of the subset to produce an output signal containing only wanted signals determined by the selection means; data storage means for storing data relating to a sought-for-feature or object which may exist in a field from which data is derived for presenting to the datasieve; comparison means for matching or comparing the stored data with the output signal of the datasieve; and selection means to select from the input signal only data having a high degree of match to the data in the data storage means.

39 Claims, 16 Drawing Sheets

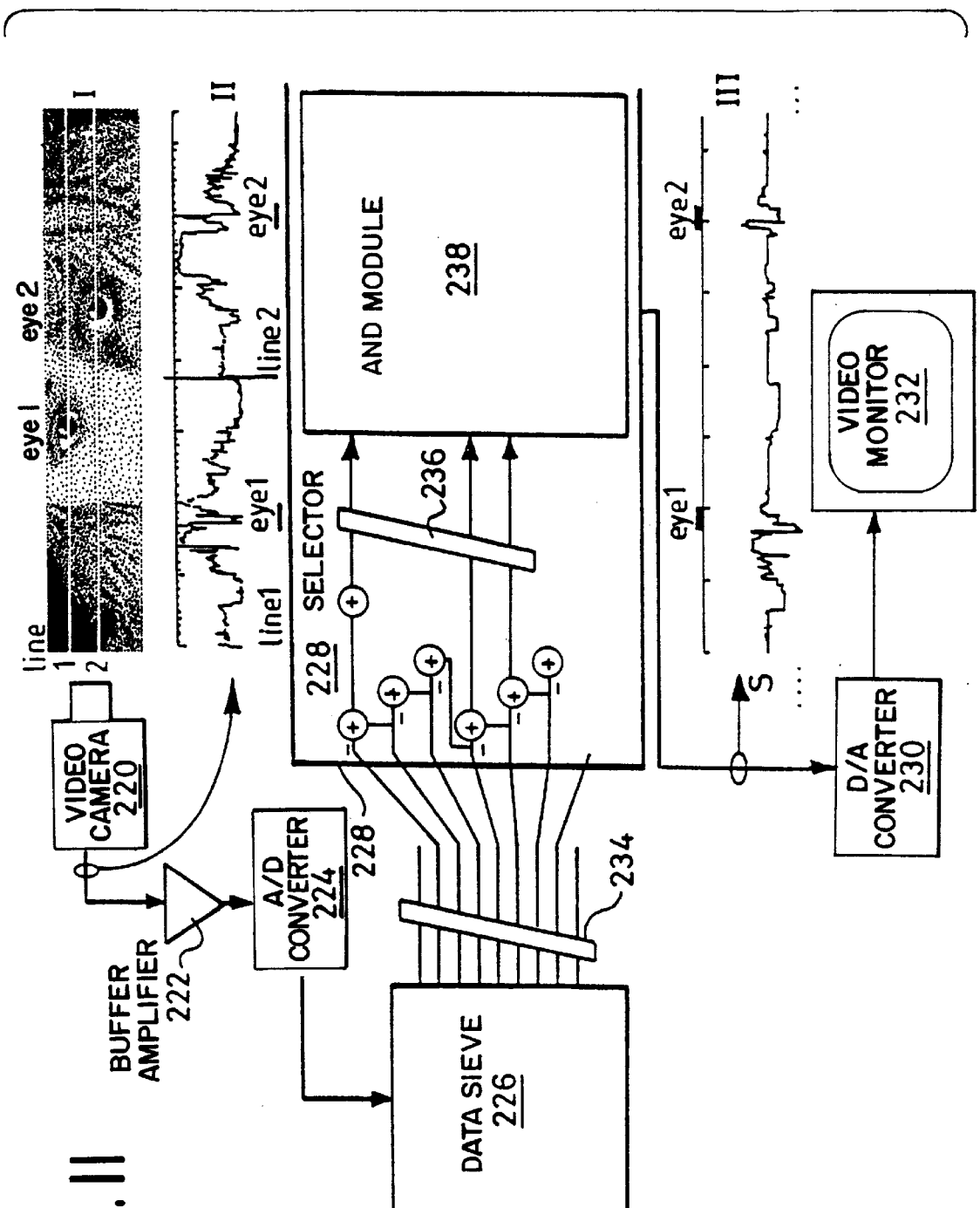

PULSE ANALYSIS USING ORDINAL VALUE FILTERING

FIELD OF THE INVENTION

This invention relates generally to signal processing and more specifically to methods and apparatus for noise reduction, signal analysis, pattern recognition and data compression.

BACKGROUND TO THE INVENTION

The invention makes use of ordinal value filters, which term is to be interpreted in the light of subsequent comments, and a brief explanation of the art relating to these filters is appropriate before describing the invention. An alternative term for ordinal value filters, sometimes used in relevant literature, is a rank filter.

A real time ordinal value filter which determines which one of a set of R applied data values is the Nth-largest, becomes a median filter if R is odd and N is made equal to (R+1)/2. In such a mode the filter provides as an output the "middle" value of the data set, having in general an equal number of other data values from the set larger and smaller than itself.

The design and operation of median filters is described inter alia in U.S. Pat. Nos. 4,441,165, 4,439,840, 4,560,974 and 45,135,440.

In a simple case of a linear array of data samples, if R=3 and N=2, the median value is the middle value of each three successive data values when the latter are sorted into order, beginning with the smallest and ending with the largest of each group of three. Since there is no averaging the median filter will remove spurious samples without degrading sharp transitions in the original sample series. Put another way, if the data samples represent a regularly sampled, time dependent signal, then the median filter has the property of not restricting the band width of the signal (which would degrade steep transitions in the original signal) but instead allows original signal transitions, representing long duration features, to be transmitted at full band width while substantially attenuating shorter duration spurious spikes, characteristic of electrical noise.

The particular threshold at which such a filter will eliminate spurious signals but pass other signals is determined by the values of R and N. The greater the number of atypical samples that represent the spurious signal that is to be eliminated, the greater will have to be the value of R.

However, it has been found that a median filter, set to eliminate spurious spikes represented by less than N samples for example, may actually introduce spurious signals that are longer than N samples in duration into the filter output, when a succession of short spikes are closer together than N sampling intervals. This can have serious repercussions if the information is contained, at least in part, in the number of samples representing the amplitude excursions in the original.

In an attempt to further enhance noise reduction, it has been proposed to repeat a median filtering step by applying the filtered signal from a first median filter, either to the input of the same filter again or to a second identical filter. If this is repeated until no further changes are introduced by the signal, it is called a root median filter. At first it was thought that this might overcome the introduction of spurious signals as discussed above, but it has been found that this repeated ordinal value filtering does not resolve the problem.

Experiments have shown that the introduction of adventitious information into the filter output is reduced when the value of R is small. For example, in the case of a linear sequence of samples, if R=3, it would appear that there is little likelihood of any spurious additional signals appearing in the output. By appropriate choice of sampling interval, a median filter with a value of R=3 should not introduce any unwanted signal transitions in the filter output signal. However, spurious signals represented by two or more samples will not be suppressed, which, when the sampling rate is high, may not result in very satisfactory noise reduction.

Increasing the number of samples representing a given signal will not necesssarily result in an increase in the accuracy of the filtered signal since the value of R has to be increased to take account of the greater number of sampling intervals which will have occurred during a given spurious noise signal spike.

The present invention, in one aspect, seeks to extend the range of filters that can be serially connected to form a datasieve, for example as described in European Patent No. 0383814 and so overcome this apparently fundamental problem associated with ordinal value filters (and median filters in particular), when they are employed to remove unwanted signals from a signal conglomerate containing broadband wanted signals, i.e. employed as a datasieve.

Thus, the present invention is also concerned with datasieves. Such datasieves are disclosed in the above mentioned European Patent and also in the research paper by J A Bangham reported in IEEE Transactions, Signal Processing vol 41: pp31 to 42 (1993). A brief explanation of these devices, now follows.

A datasieve may consist of a cascade (series) of ordinal (rank order) filters of increasing window size. However, it is to be understood that the ordinal filter at each stage may comprise more than one processing device; for example a filter may comprise one or more median filters, a sequence of max, min, min, max or min, max, max, min filters, or the rank may vary fom one to another of the stages. The terms "ordinal filters" and "rank filters" therefore have to be understood to include combinations of max/min operators, e.g. max/min morphological operators, and it is an aspect of this invention also to include weighted order filters, which have hitherto been used specifically only for noise reduction, and furthermore "forced" root filters as later described. Weighted median filters for noise reduction are well documented in specialist literature. An example is now outlined.

An ordinal filter is characterised by the number of sample values stored within the window. Then one of the values is selected for output. In the case of the median this is the middle ranked value, but other ranks (including maximum and minimum) can be selected. In one implementation of a weighted ordinal filter, multiple copies of each sample value are stored in the window and the rank selected as hitherto mentioned. Normally, but not essentially, the values in the centre of the window are given more weight than those at the edges and the median of the total number of samples is taken. For example, typical weights are: 1,1,2,5,5,2,1,1 in which case the 7th value in the sorted set is taken as the median. In one implementation of this circuit, the weights represent the number of copies of each sample input that are stored within the weighted median filter. This can be understood from FIG. 1 of the accompanying drawings, wherein SH1.1$i$,SH1.2$i$,SH1.3$i$ are sample and hold amplifiers that store 3 samples input to stage 1 of the overall filter. These represent the input window to stage 1 of the datasieve. By connecting SH1.1$i$ to SH1.1 one copy is included in the sort. By connecting SH1.2$i$ to SH1.2, SH1.3 and SH1.4 three copies are included in the sort. Likewise SH1.3*i* is connected to SH1.5. This is not the only method for implementing a weighted median filter that has been documented in the specialist literature for noise reduction purposes.

Another aspect of the present invention lies in the incorporation of a series of weighted ordinal filters in a datasieve, for example for signal analysis, pattern recognition, noise reduction and data compression. A further aspect of the invention lies in a method for forcing a median filter output at each stage to a median root that is similar to but not identical to, the output obtained by repeated median filtering.

The present invention also principally concerns circuits for rapidly and efficiently implementing datasieves. In a simple circuit, such as that described in the abovementioned European Patent, there is an implication that at large R the number of values that need to be sorted will also be large. In practice this could limit the practicable use of datasieves both because of the complexity involved and the scale of the circuitry necessary to implement the datasieve and the time that such circuits would take to operate, especially if it is required to use datasieves for video image processing.

Hitherto datasieves have been implemented using standard median filters or standard morphological filters. The former involve a significant amount of sorting. On a computer this is time consuming so a number of attempts have been made to find hardware circuits to perform the median finding operation, see for example the Marconi MA7190 quoted in FIG. 4 and S D Richards "VLST Median filters" (IEEE ASSP vol.38: pp145–153). Although these designs fast, the size of window that can be implemented is still small by datasieve standards, for example, the MA7190 can only manage 15 samples. This is also true of standard morphological filters. Published work is confined to methods that involve small structuring elements (windows) by datasieve standards. It should be appreciated that it is not until a datasieve structure is used that there is any pressure to use large windows or structuring elements. It is only since the recent development of the datasieve, with its improved properties, that the need has arisen.

Yet a further aspect of the invention therefore aims to take advantage of the particular properties of the datasieve which make possible the implementation of simpler circuits, for example to enable complete processing to be achieved in a period of the order of seconds rather than the many hours necessary with existing proposals. This makes it practical to implement circuits that are more complex than those used for noise reduction.

Thus, the present invention also concerns signal analysis, and in particular analysis of image-containing signals. Existing systems will therefore now be briefly discussed.

Conventionally image analysis pattern recognition systems capable of handling multiple patterns at different scales concern two steps:

1. a re-representation of the optical image in a form suitable for classification, and 2. the step of classifying the object content of the re-represented data.

Often, linear multiscale transformers such as Gaussian filter banks are used in a data decomposition process in combination with edge detection and where appropriate thresholding.

The classifying step necessarily discards information when a decision is made such as "is this object an "X" type of object?".

However it has been found that conventional systems as outlined above are not capable of identifying similar complex objects of a given type from the field of view containing a multiplicity of data some relating to objects of the given type and others data relating to objects which are similar to but not identical to the given type of object, by matching or comparing the original image with a mask (itself derived from or accurately describing one of the complex objects within the original field), thresholding the result and attempting to identify and extract only data relating to objects having the same shape and pattern characteristics of the mask object (i.e. given type of object) by convolution with the mask. Conventional systems such as outlined have been found not to be selective enough in practice to exclude object data from objects which are very similar in frequency composition but not identical to the given type of object.

Signal decompositions can be used for pattern recognition in two distinct ways.

In one method signal decompositions provide multiscale smoothing prior to edge detection; this is beneficial for extracting only the significant edges from a noisy image. Many pattern recognition schemes use edge detection as a pre-processing step before classification. The datasieve provides good localisation of edges even in impulsive noise, which is desirable for robust pattern recognition.

An alternative method is to use a matching process, such as cross-correlation, to identify a target pattern within a noisy signal. The later described examples (FIGS. 9A, 9B, 10A and 10B) show that applying a matching process in the granularity domain obtained from the datasieve gives improved results compared with matching directly in the spatial (pixel) domain.

Alternatively, it may be stated that general pattern recognition systems, able to handle multiple patterns at different scales, should consist of two major steps, 1) the re-representation of the visual world in a form that is appropriate for 2) the classifier. This is illustrated in FIG. 8. For a system to be flexible, stage 200 should preserve all important information and therefore it should be possible to reconstruct the key features of the original signal 202 from the signal primitives 212. It is sometimes necessary to include extra processing stages 204,206 at this point. Linear multiscale transforms, such as Gaussian filter banks, are widely used for stage 200, because they allow reconstruction from the signal primitives.

Step 2, the classifier 209, necessarily discards information when a decision has to be made, for example, the binary decision "is this an "eye" or not?". Only one threshold stage 208 may be necessary, but usually this is not enough. For example, FIG. 9A and 9B show that a classical matched filter cannot discriminate the right eyes from all the surroundings and other features, e.g. sideburn/ears appear to be eyes when the original image (FIG. 9A) is cross-correlated with the mask (centre-most eye), the result is thresholded and the eyes revealed by convolution with the mask (FIG. 9B).

It is an object of the present invention in still another aspect to provide an improved image analysis system capable of reliably selecting objects having a particular shape and pattern (the target) from a field containing a plurality of such objects, in addition to many other objects some of which have very similar characteristics to those of the mask (target) object.

It is also an object of the invention, in yet another aspect, to provide a system for compressing image data without loss of the data relating to the significant elements making up the image.

THE INVENTION

The invention in one aspect comprises a method of pulse analysis applied to a signal conglomerate represented as a set of data samples in order to remove unwanted signals from broadband wanted signals, comprising the steps of:

(i) ordinal value filtering at least a selected part of the signal conglomerate with a succession of filters with windows sizes that include a number of samples increasing from N (being less than M) up to M the input to each successive filter being the output of the previous filter, the bandpass output, representing the granularity, being obtained by subtracting the current filter output from the previous filter output, ad the granules being the non-zero segments of the bandpass outputs;

(ii) selecting from the band pass outputs of the succession of filters a predetermined subset of the band pass filter outputs; and (iii) adding together the pulses of the subset to produce an output signal containing the wanted pulses determined by the selection.

For low pass filtering more especially, the method may include an arrangement in which the bandpass filter outputs forming the subset are selected to produce an output signal containing only pulses which include not less than a predetermined number of data samples.

The selection and arithmetic steps may be carried out within the succession of filters.

Where the conglomerate of items of data is in one dimension and are spaced by distance and/or time, the selected groups may comprise groups of successive bandpass filter outputs. Where the conglomerate of items of data is in two dimensions, the selected groups may comprise successive similar arrays of the sampled values, each group including sample values from at least two such arrays.

It has been abovementioned that a further aspect of the invention concerns the forcing of a median filter output at each stage to a median root. It is observed that, in one-dimensional arrays, the filtering operation at each stage of the datasieve becomes idempotent, ie, producing no further changes, when filtering is repeated at any particular stage. This is a desirable feature of a filtering process to be incorporated at each stage the datasieve, and it can be achieved by a root median. However, forcing a root by methods later described herein produces an output that is only slightly inferior but is significantly faster than the root median. This method is also applicable to two-dimensional or multi-dimensional arrays.

It has also been mentioned above that the present invention aims to provide simpler circuitry for signal processing based on datasieves. For example, it is observed that at any particular stage of the datasieve certain segments of the signal are not changed and is found that the extent of these unchanging segments increases as the signal passes to later stages, with larger R. By flagging these segments it is possible to reduce the amount of rank processing so as to simplify and speed up the data sieving process. Computer simulations show that this improved method in accordance with the invention can be up to 3,000 times faster than the original method. The simplification process concentrates the signal processing on features in the original signal associated with granules. By exploiting the flags set in the above described process it is also possible to accelerate a pattern-matching process.

The process of matching in the granularity domain is similar but not identical to that of cross-correlation applied to the granularity image at each stage of the datasieve composition. For example, a 1,000 sample signal decomposed to 1,000 different mesh (scale) granularity images using a 1,000 stage datasieve arrangement, in which an object represented by 50 samples is sought, implies finite convolution of the 50 sample feature vector with up to 50×1,000=50,000 samples, a total of 2,500,000 multiplies. The matching process herein described using the granularity domain can thus be reduced to 2,500,000 AND operations (1 bit correlations), because quantisation of the granule amplitude to 1 bit does not reduce matching sensitivity significantly. More importantly, by exploiting flagging circuits, earlier mentioned for fast decomposition, it can be reduced to at most 50×1,000 AND operations, or more typically using 25×500 AND operators. Thus reduction is achieved to at most 0.5% of the original number of AND operators. Unlike convolution methods, further saving can be made by modifying the order in which the matching operations are performed. For example, starting the matching process with the largest granules and working towards the smallest, abandoning the search once the probability of finding a successful match has become negligible, can also simplify circuitry and save operation time.

Efficient implementation of the datasieve by flagging local extrema, monotones and, in constant regions (in ID runs) be practised by the following method. The approach can be used for any datasieve, although it is described for the case of a one-dimensional decomposition. In the case of an alpha filter (defined as the sequence man/min, min, max) and a beta filter (defined as the sequence min, max, max, min), the maxima and minima extrema are usually processed in different passes. First, let m be the stage of the datasieve; in the case of median sieves the window is 2m+1 samples; in the case of alpha and beta filters it is m+1 samples. 1) It is convenient, but not essential, to run-length code the inputs to each sieving stage and then perform the filtering process using the run-length coded signal. In the case of one-dimensional signals run length coding is relatively simple, in two-dimensional (or multidimensional) signals there are several ways of coding the signal; for example as two separate orthogonal one-dimensional run-length coded signals or as a one-dimensional signal traversing the two-dimensional image.

2) Record the run-length of at least the shortest run (RLs) that forms an extrema, it being understood that an "extrema" is a region that is locally maximum or minimum. of the end of the extrema depending on the type of sieve. There is no processing to be done at any of the stages for which m is less than RLs. Thus the inputs to these stages are relayed to each output either directly or by transferring addresses in a data buffer. This effectively skips stages until the filter stage has an m equal to the length of the shortest extrema run (RLs) and represents one time saving process.

3) Flag segments of the signal that are monotonically going up, going down and those runs that lie between the two, namely the extrema. Note that monotones can include runs of more than one sample. Depending on the state of these flags, the locally monotonic input segments and runs longer than m or m+1 depending on the type of sieve, are relayed to the output. This represents another time saving step.

4) Process only those runs that form extrema and are also shorter than or equal to m samples in duration. It is a property of the datasieve that the processing step need only involve the extremum value and the values of adjacent signal samples.

It should be understood that the principle of identification of extrema, monotones and constant regions in the data before filtering at each stage of the datasieve is equally applicable to multidimensional signals.

In another efficient implementation of a datasieve the datasieve properties are exploited to reduce the combination logic required to implement each stage of the datasieve. each stage of the datasive is equally applicable to multidimensional signals.

In another efficient implementation of a datasieve the datasieve properties are exploited to reduce the combination logic required to implement each stage of the datasieve.

This method for the efficient implementation of the datasieve takes advantage of the observation that the signal becomes simpler as it passes through the datasieve. Two steps are involved in the design of circuits that take advantage of this property. In the following discussion one-dimensional median datasieves are described. However, the strategy is applicable to other datasieves and to multi-dimensional datasieves:

1) threshold decomposition of the signal, i.e. an 8 bit signal could be thresholded to form 256 binary signals the sum of which yields the original 8 bit signal. Each binary signal is then median filtered independently. The results can subsequently be added together to form the greyscale median filtered signal. The stacking property of any positive boolean function ensures that filtering the binary signals is equivalent to filtering the greyscale signal. In the datasieve it is not necessary to recombine the signals between filtering stages.

2) three point binary median filtering operation of the first stage implemented by the following process, where the window contains values in a, b, c, and the output of the filter, at one level of the stack, is f.

The truth table for values in the window is

| a | b | c | f |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 | and after simplification (K maps) the resulting function is $$f=ab+bc+ac$$

The second stage has a window of 5 and contains values in a, b, c, d, e. Superficially, this filtering stage could be implemented using the following truth table:

| a | b | c | d | e | f |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 1 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 1 | 1 | which yields $$f=cde+bde+bce+bcde+ace+acde+abe+abd+abde+abc+abce+abcde$$

which simplifies to $$f=cde+bde+bce+ace+abe+abd+abc.$$

However, further simplifications are possible if the sieve is a root median sieve or an alpha or beta sieve or a forced root sieve because certain combinations of input will not occur. Consequently the output from these combinations can be set to "don't care" states

| a | b | c | d | e | f |
|---|---|---|---|---|---|
| 0 | 0 | 0 | 0 | 0 | 0 |
| 0 | 0 | 0 | 0 | 1 | 0 |
| 0 | 0 | 0 | 1 | 0 | X |
| 0 | 0 | 0 | 1 | 1 | 0 |
| 0 | 0 | 1 | 0 | 0 | X |
| 0 | 0 | 1 | 0 | 1 | X |
| 0 | 0 | 1 | 1 | 0 | 0 |
| 0 | 0 | 1 | 1 | 1 | 1 |
| 0 | 1 | 0 | 0 | 0 | X |
| 0 | 1 | 0 | 0 | 1 | X |
| 0 | 1 | 0 | 1 | 0 | X |
| 0 | 1 | 0 | 1 | 1 | X |
| 0 | 1 | 1 | 0 | 0 | 0 |
| 0 | 1 | 1 | 0 | 1 | X |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | X |
| 1 | 0 | 0 | 1 | 1 | 1 |
| 1 | 0 | 1 | 0 | 0 | X |
| 1 | 0 | 1 | 0 | 1 | X |
| 1 | 0 | 1 | 1 | 0 | X |
| 1 | 0 | 1 | 1 | 1 | X |
| 1 | 1 | 0 | 0 | 0 | 0 |
| 1 | 1 | 0 | 0 | 1 | 1 |
| 1 | 1 | 0 | 1 | 0 | X |
| 1 | 1 | 0 | 1 | 1 | X |
| 1 | 1 | 1 | 0 | 0 | 1 |
| 1 | 1 | 1 | 0 | 1 | X |
| 1 | 1 | 1 | 1 | 0 | 1 |
| 1 | 1 | 1 | 1 | 1 | 1 | which after simplification using K-maps yields (using only positive boolean expressions, i.e. expressions that do not include complements such as NOTa, NOTb, NOTc, NOTd, NOTe, gives e is true:

|  | ab |  |  |  |
|---|---|---|---|---|
| cd | 00 | 01 | 11 | 10 |
| 00 |  | X | 1 |  |
| 01 |  | X | X | 1 |
| 11 | 1 | 1 | 1 | X |
| 10 | X | X | X | X | e is false:

|  | ab |  |  |  |
|---|---|---|---|---|
| cd | 00 | 01 | 11 | 10 |
| 00 |  | X |  |  |
| 01 | X | X | X | X |
| 11 |  | 1 | 1 | X |
| 10 | X |  | 1 | X |

$$f = ac + bd + cde + abc + ade$$

This simplification becomes more effective as the window gets larger, since there are ever more don't care states. As a result the logic required to implement each stage of the sieve increases in complexity at a lower rate than non-sieve implementations of rank decompositions. An aspect of the present invention concerns the implementation of datasieves using the reduced logic circuits obtained by the above exemplified means.

Another important aspect of the invention concerns pattern recognition, as previously mentioned. In its broadest aspect, the invention provides a method of pattern recognition in data that describes a field containing objects. The process comprises the steps of successively ordinal filtering the data with increasing windows size, and matching or comparing (in the general sense) the resulting transformed data with the transformed data describing one particular object which is to be identified according to shape or pattern or both, and generating an output signal containing data relating only to objects having the said characteristics of the particular object.

It is to be understood that the information required for matching is not only contained in the granularity resulting from the decomposition but also in the pattern of flag locations generated by the previously described fast algorithm (which are related to the positions of granules).

Each ordinal filter may be weighted median filter.

The ordinal filtering may be performed in one, two or more dimensions relative to the objects in the original field.

Discrimination based on scale may be performed on the filtered output.

The original data may be one-dimensional signals, one-dimensionals signals obtained by scanning multidimensional images, or may in themselves be multidimensional such as two-dimensional images.

A cascade of ordinal filters in which the input of each filter is composed of the output from the previous filter and in which each successive filter has an increasing window size, has been described elsewhere as a datasieve.

It is to be noted that certain patterns in the input signal lead to the root median filtering stage taking a long time. In practice this is not found to be limiting; indeed no case of natural data or image has yet been encountered where this is a problem. However, a method has been found for ensuring that a root signal can be output at each stage of the datasieve. This ensures that the median datasieve is always as simple in design as an alpha or beta datasieve.

Thus, the invention also lies in a datasieve in which a "forced" root is produced at each stage. An "oscillation" flag is set whenever contiguous extrema are of the same duration. The solution is not to median filter these samples but to force the output to a succession of values that lie at or between the set of contiguous values where no run is less than or equal to m for that stage.

The invention also lies in a datasieve employed as the picture signal decomposition element in an image analyser adapted to perform pattern recognition by including data storage means for storing signals which describe a particular element within a field of view, and means for matching or comparing data described in a particular element within a field of view, and means for matching or comparing data describing the particular element with the output of the datasieve and selecting only data for which high correlation is found. The correlation level may be adjusted to improve selectivity.

The invention thus also lies in an image analyser embodying a datasieve as aforesaid, data storage means for storing data relating to a sought-for feature or object which may exist in a field from which data is derived for presenting to the datasieve, and means for matching or comparing the stored data with the output of the datasieve, to select from the input signal only data having a high correlation to the data in the data storage means.

The cross-matching may be performed by storing the output representing the mask (target) of interest from some or all of the different stages (or the differences between successive outputs from the different stages) of the datasieve, in the storage means, and matching or comparing the stored data with data (or differences in data) obtained from the same stages of the datasieve from which the stored data (or differences) have been derived, during subsequent passage of image data through the datasieve, outputting the cross-matched signals, and subjecting same to a threshold to exclude all the signals which have a given level of cross-matching the level being determined by the threshold.

Still another aspect of the invention concerns data compression.

A method of data reduction in accordance with the invention comprises the steps of subjecting data relating to an image to a datasieve, selecting the signals passed by the m'th ordinal filter in the chain of filters making up the datasieve, and combining therewith only a fraction of the larger granules obtained from the preceding stages of the datasieve. FIGS. 10A and 10B show an example of this process in which about 10% of the granules have been retained. This results in significant image data compression by only adding back to the degraded image data from the (m'l)th stage the more significant parts of the data removed by the preceding stages.

The invention also lies in signal filters as aforesaid such as may for example be used to eliminate unwanted content from a digital data signal such as signals derived from sound or from scanning an image.

DESCRIPTION OF EMBODIMENTS

The various aspects of the invention are further described with reference to the accompanying drawings, a few of which have already been briefly referred to. In the drawings:

FIG. 1 illustrates the principle of a weighted median filter;

FIG. 2 schematically illustrates a pulse analysing system in accordance with the invention;

Figure 5:
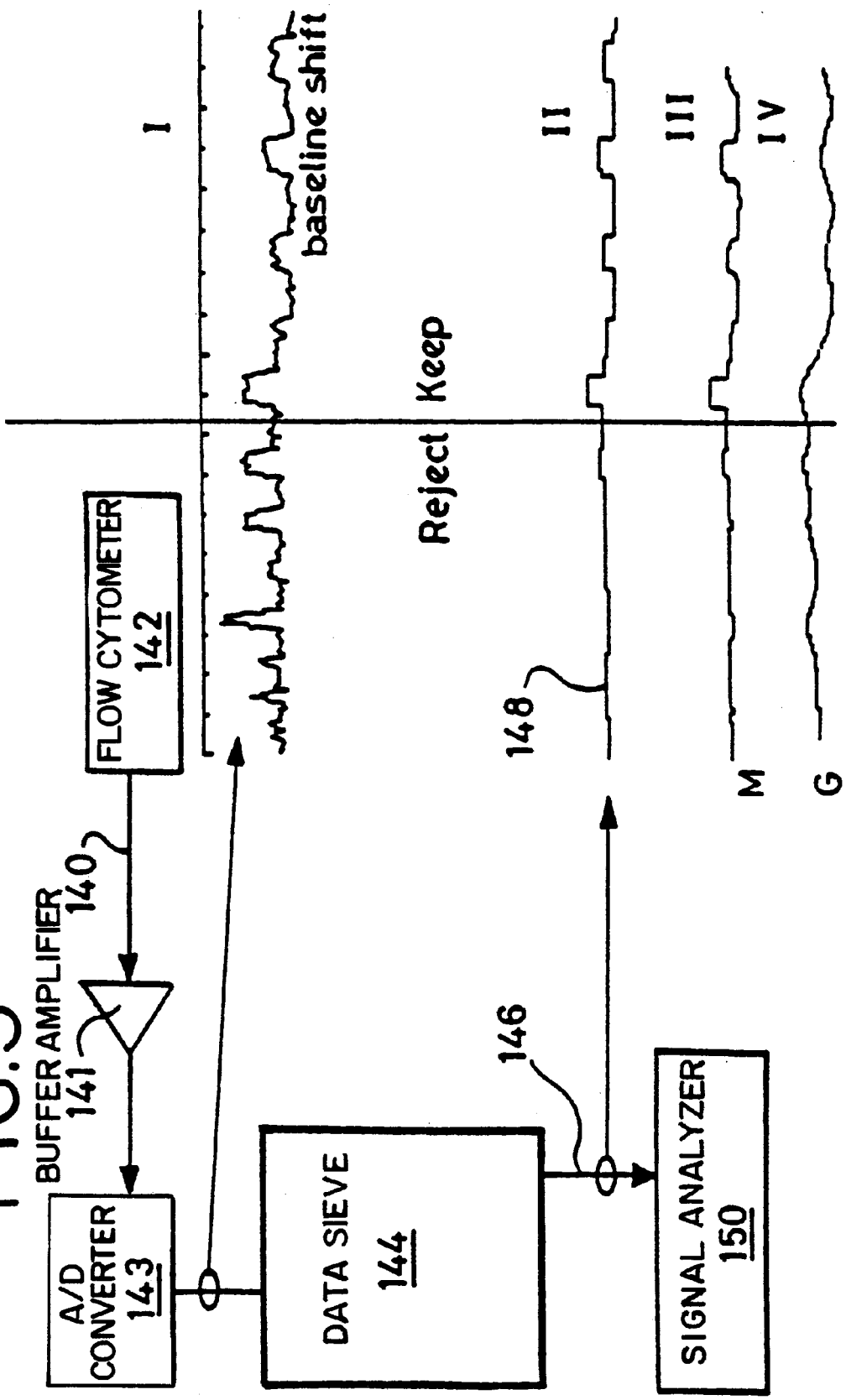
Figure 6:
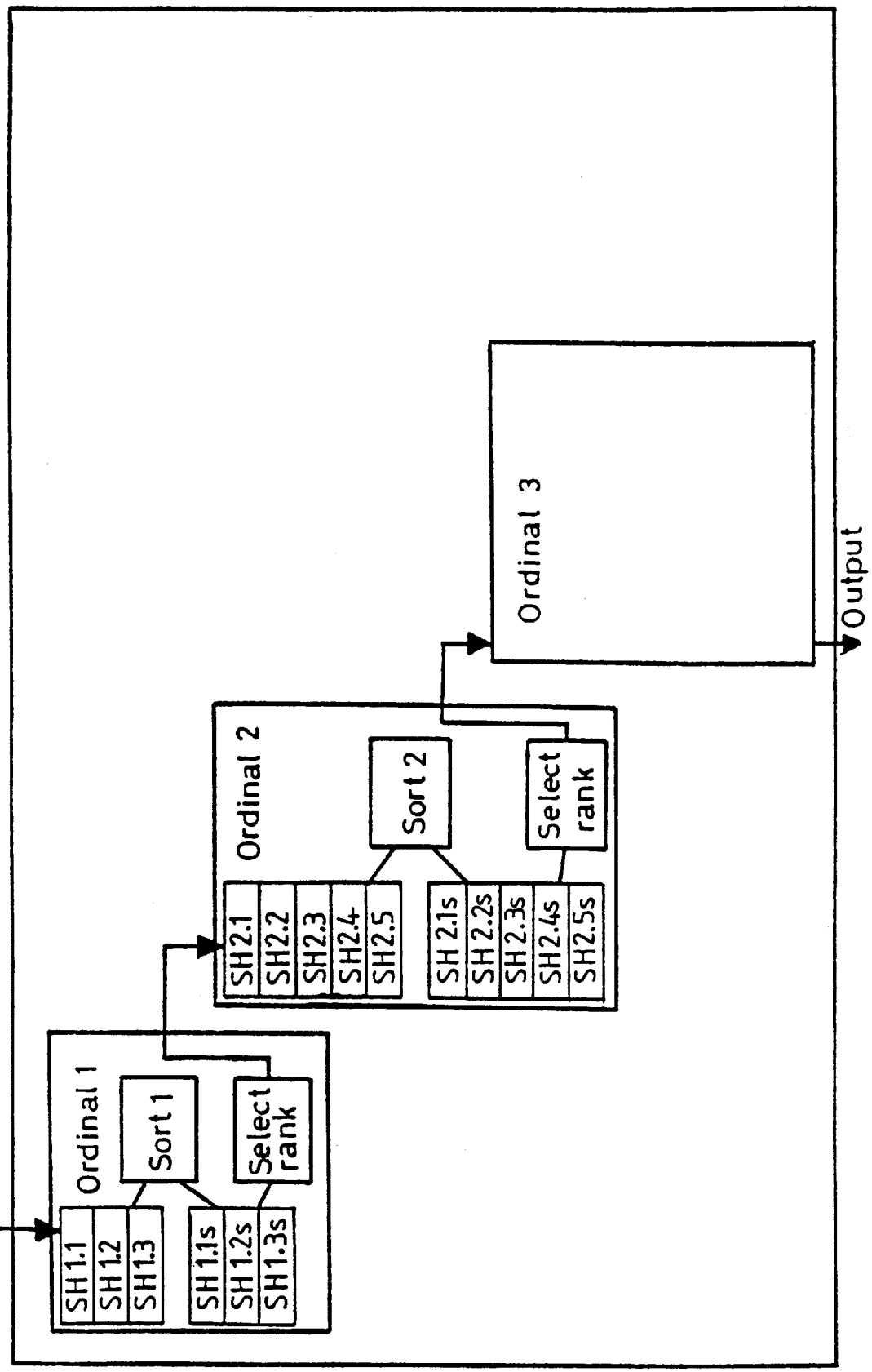
Figure 7:
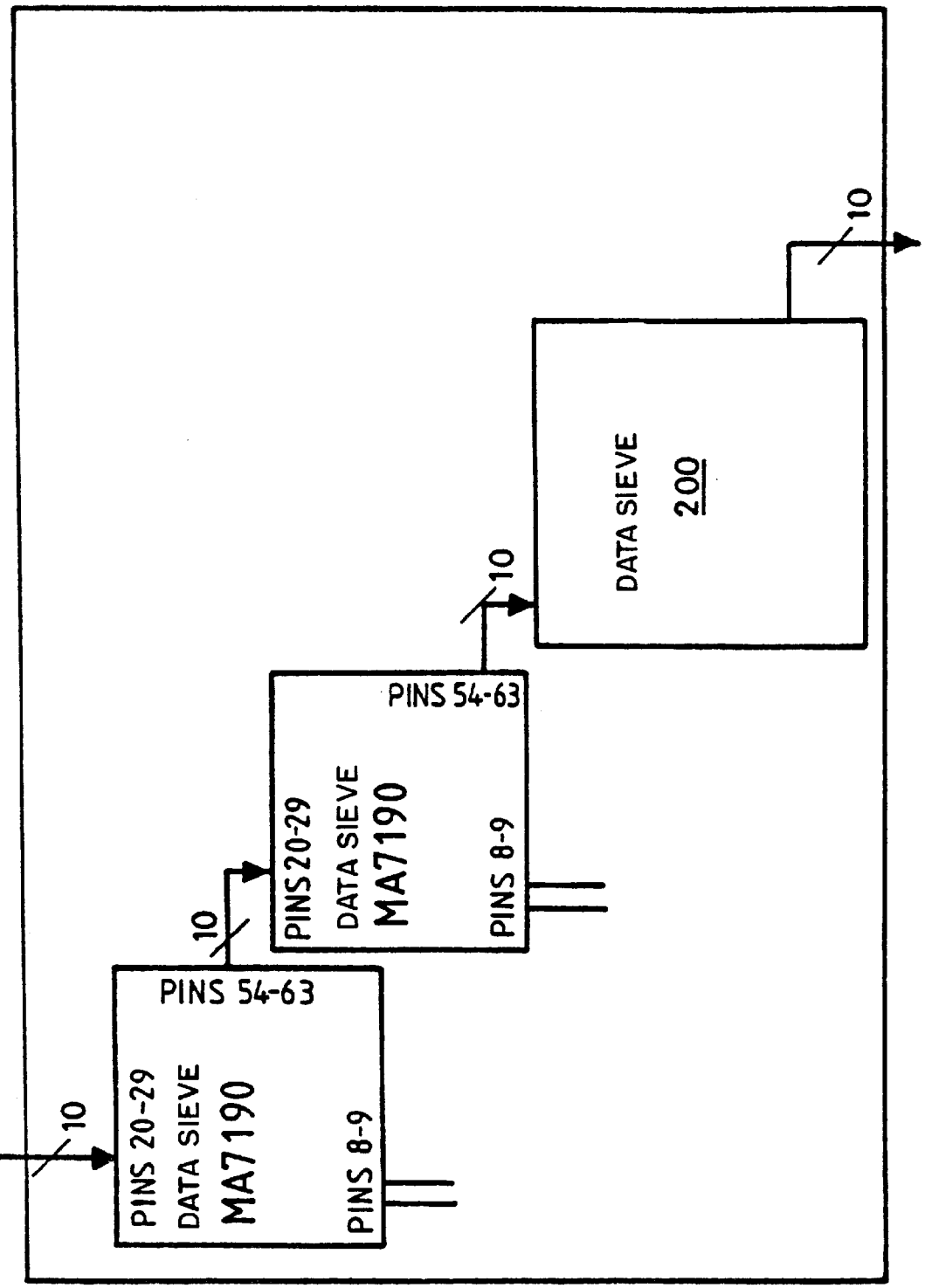
Figure 8:
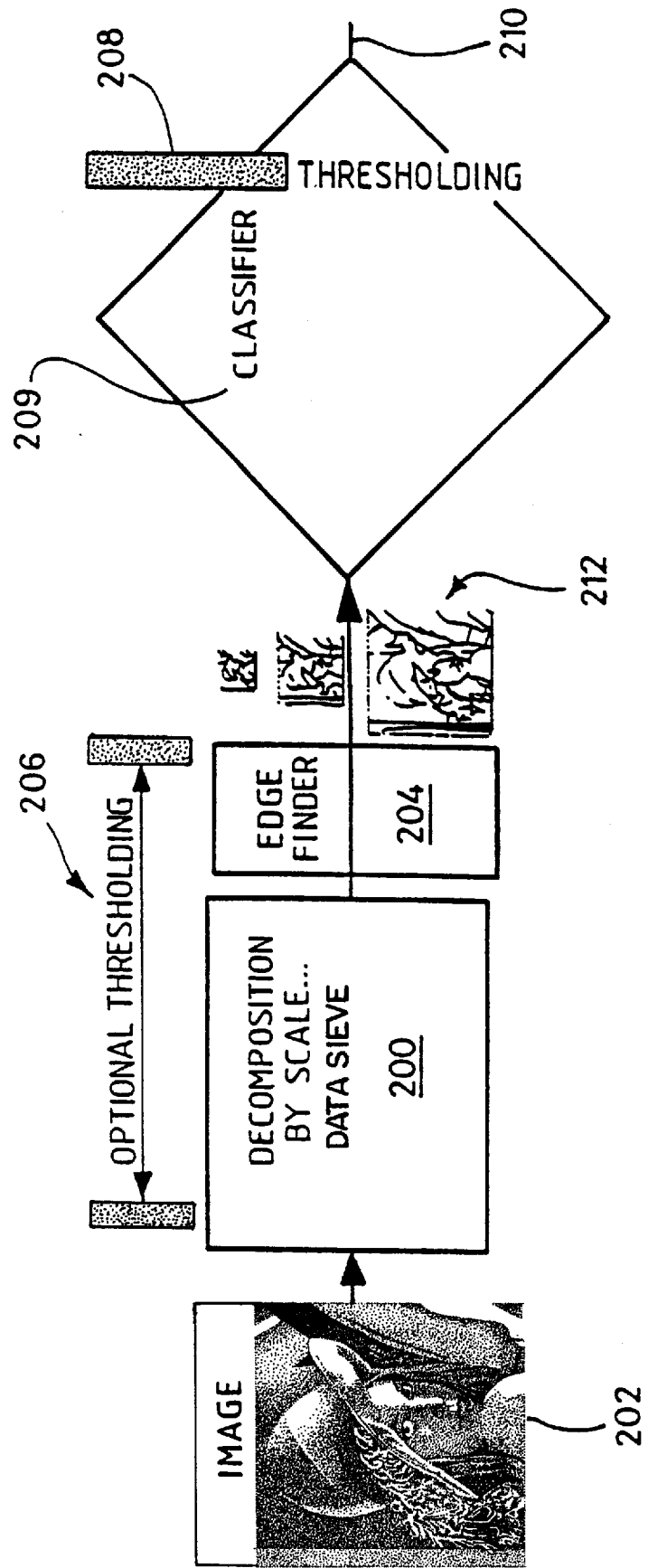
Figure 12:
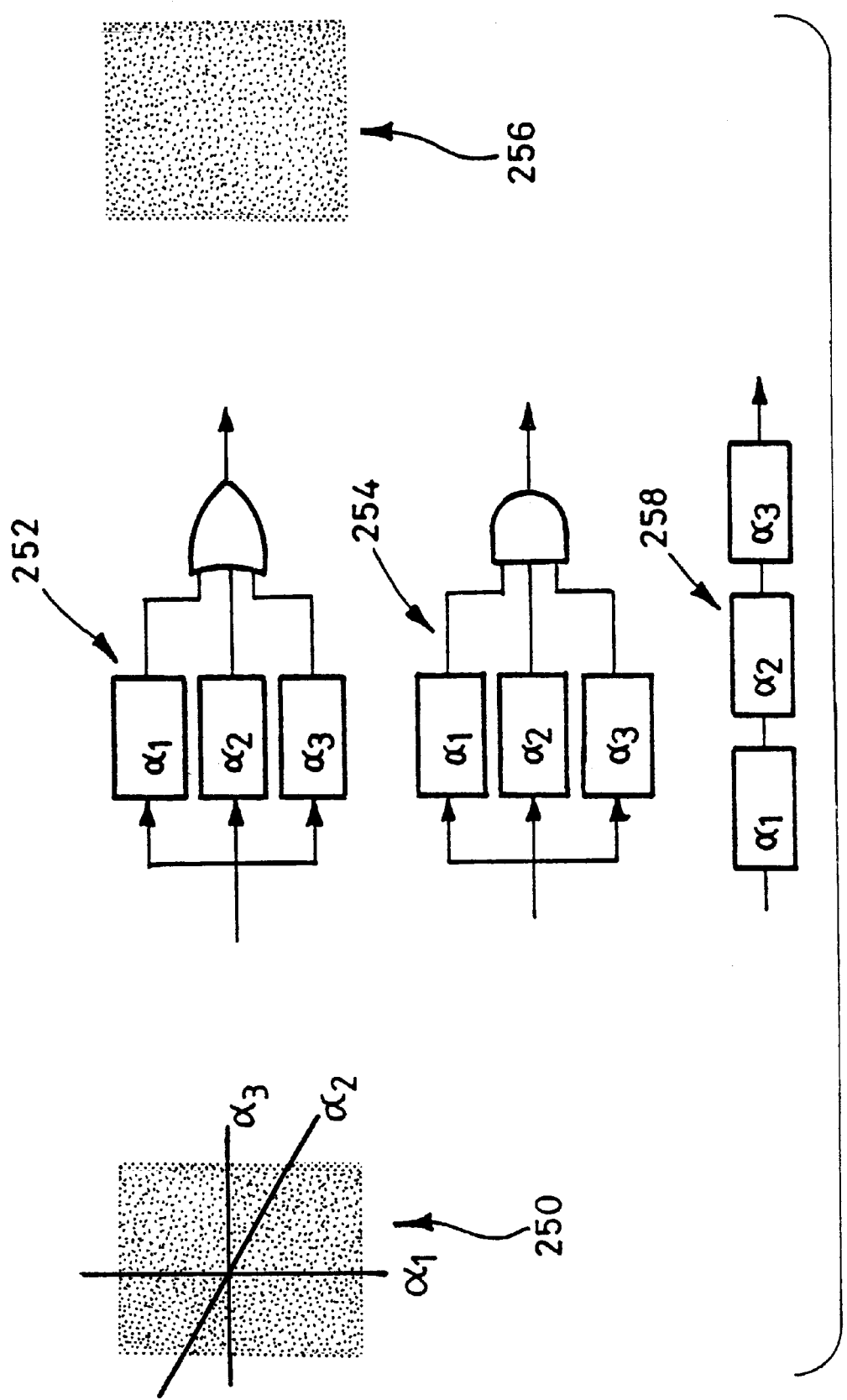
Figure 13:
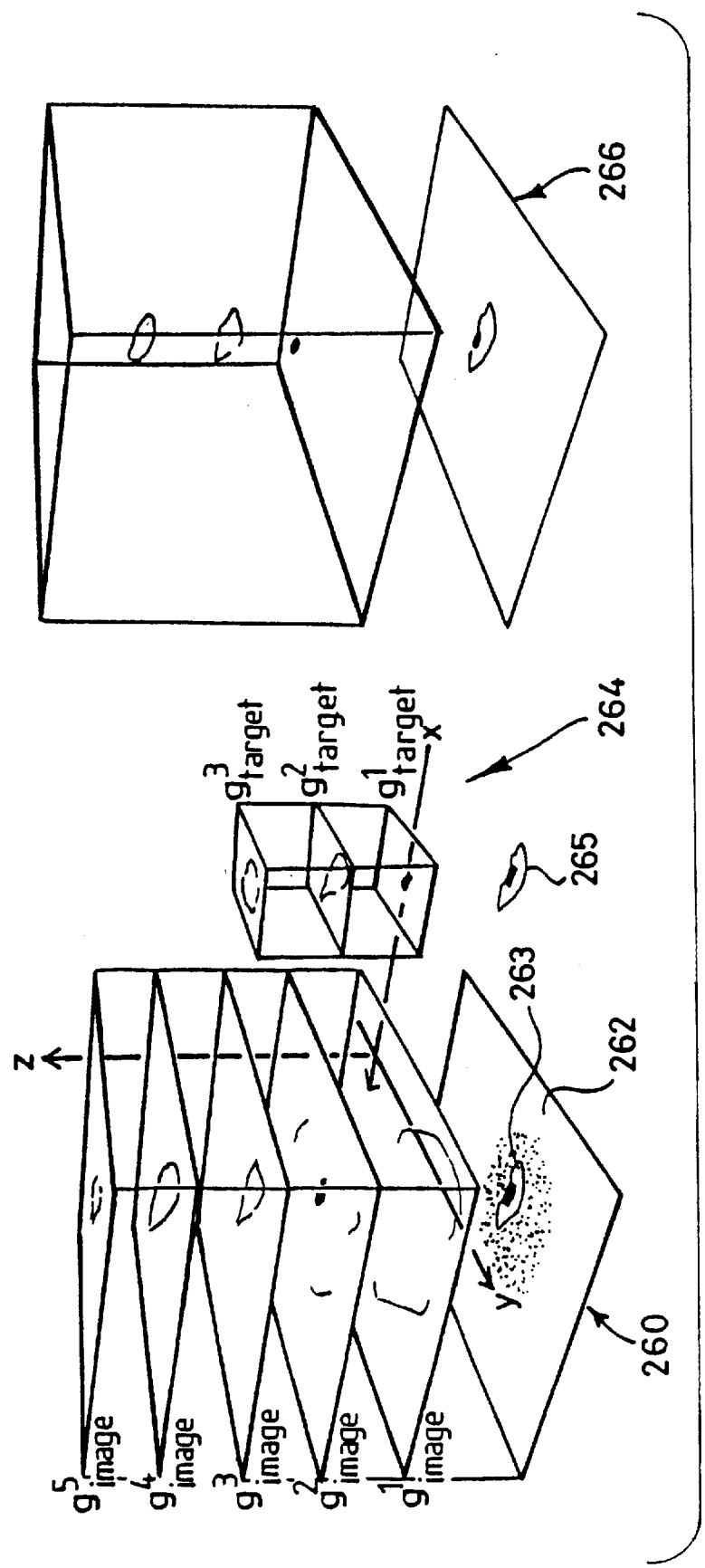
Figure 14:
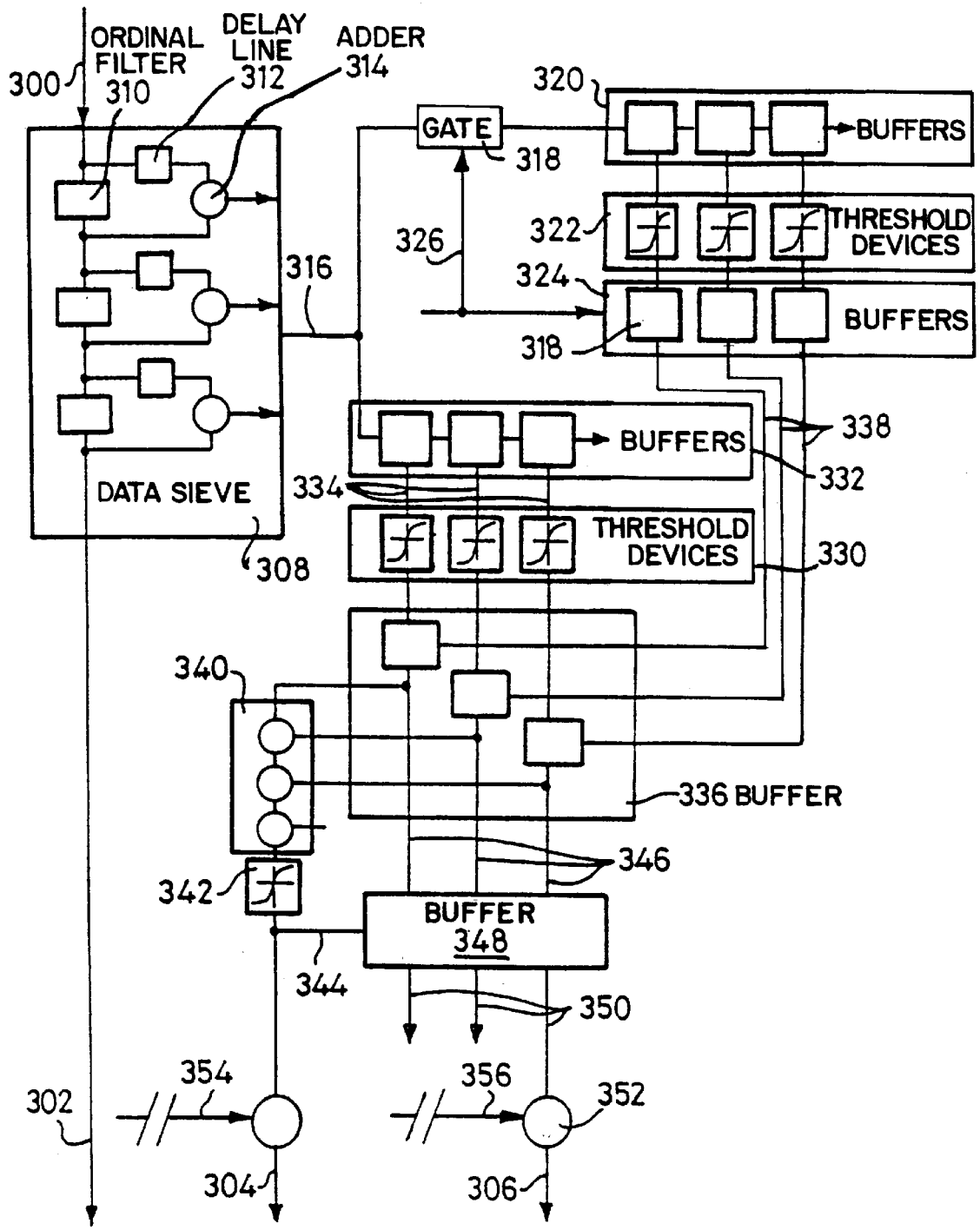
Figure 15A:
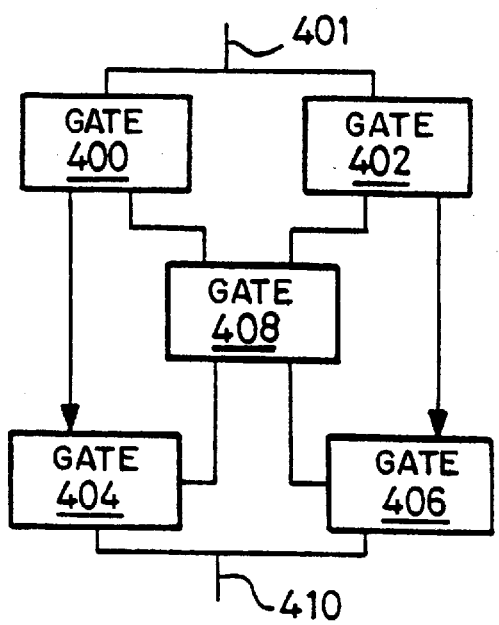
Figure 15B:
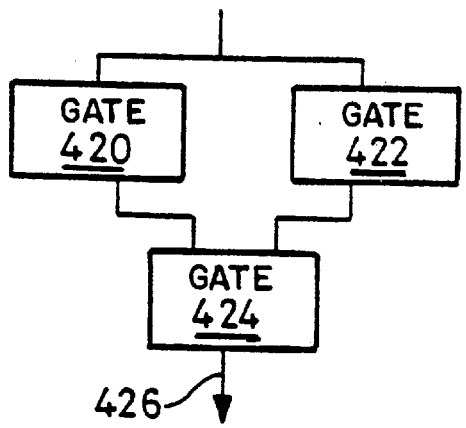

FIG. 5 schematically illustrates an alternative pulse analysinq system;

FIG. 6 is a circuit diagram of the alternative system;

FIG. 7 shows a practical embodiment of the circuit of FIG. 6;

FIG. 8 shows an image analysis system;

FIGS. 9A, 9B, 10A and 10B show the results of use of the system of FIG. 8;

FIG. 11 shows another image analysis system;

FIG. 12 shows methods for analysing two-dimensional images using one-dimensional datasieves;

FIG. 13 illustrates use of a matched datasieve for image processing;

FIG. 14 shows a combined datasieve and image classifier;

FIGS. 15a and 15b shows the combination of two image decomposition systems; and

Figure 16:
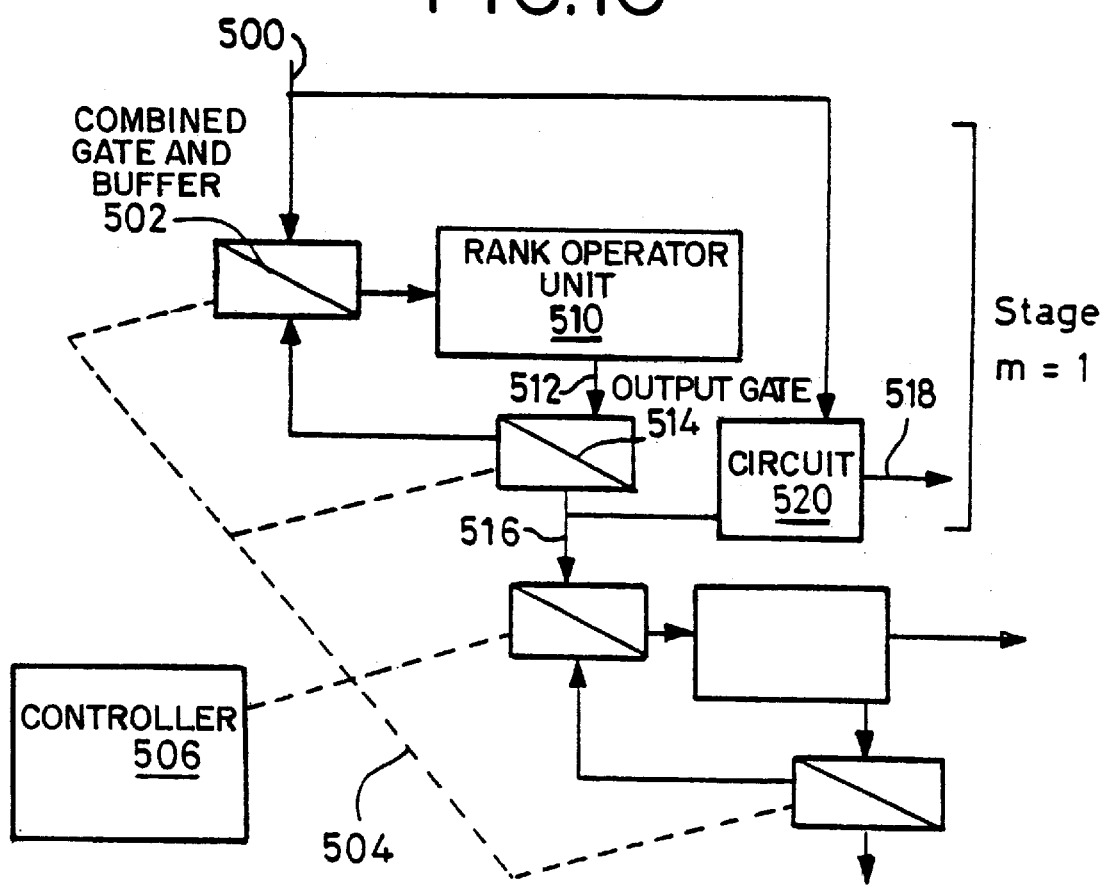
Figure 17:
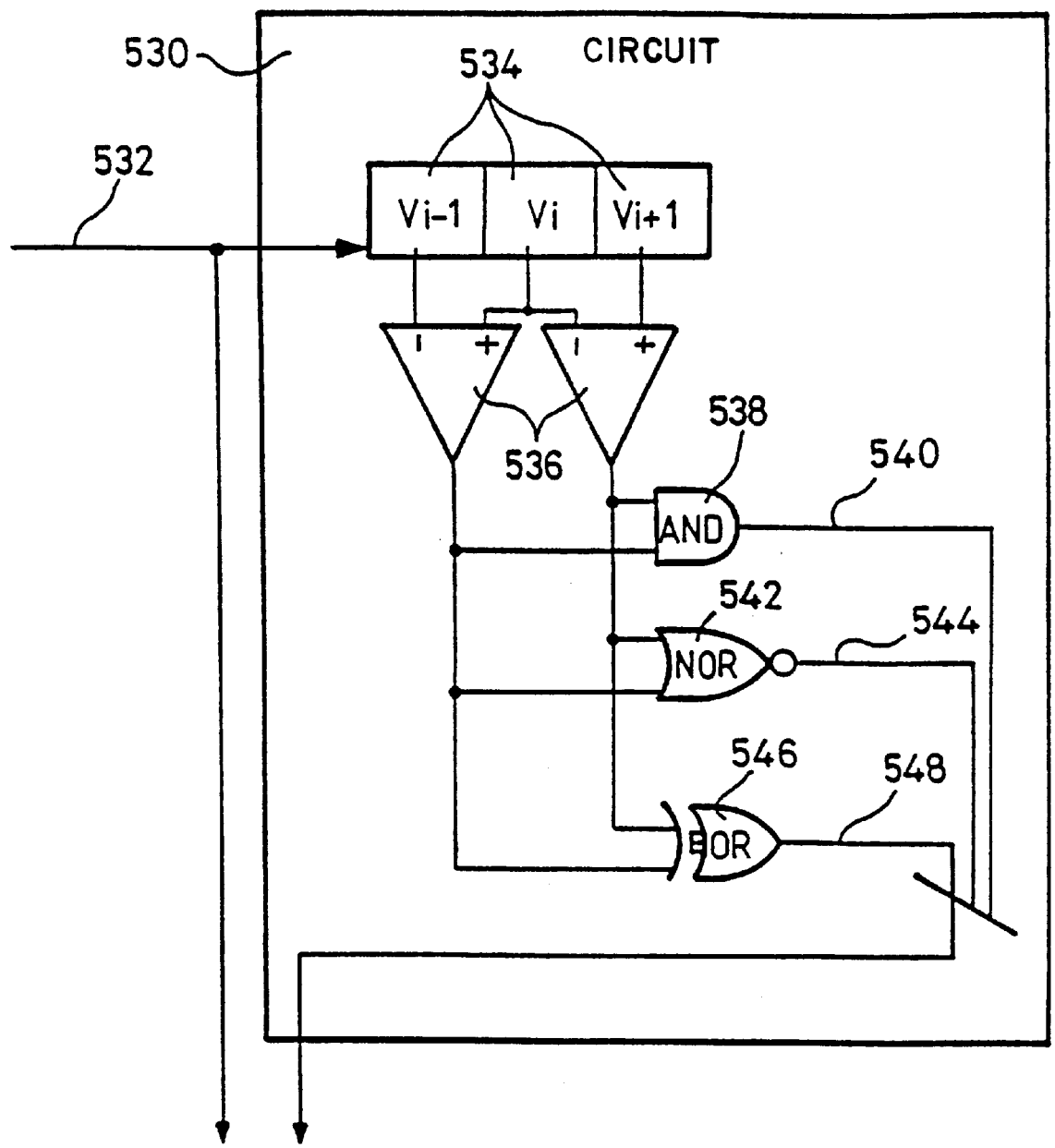
Figure 18:
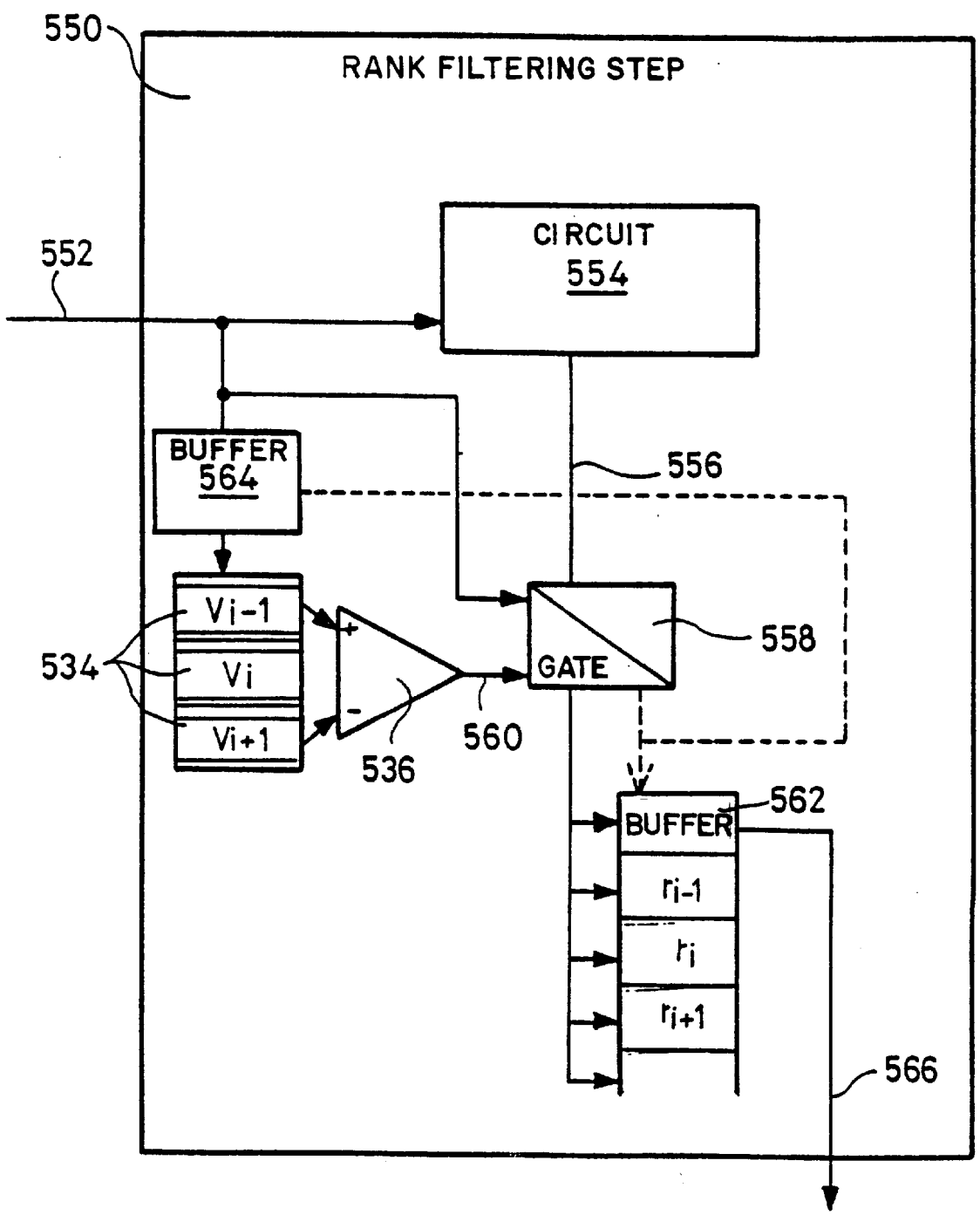

FIGS. 16 to 18 are diagrams relating to a fast datasieve.

For convenience, the different aspects of the invention are described firstly with respect to basic datasieve operation, including noise reduction and pulse analysis, and secondly with respect to pattern recognition. Data compression and linear/non-linear switching are also incorporated in the description and, finally, implementations of the fast datasieve circuits are described.

Figure 1:
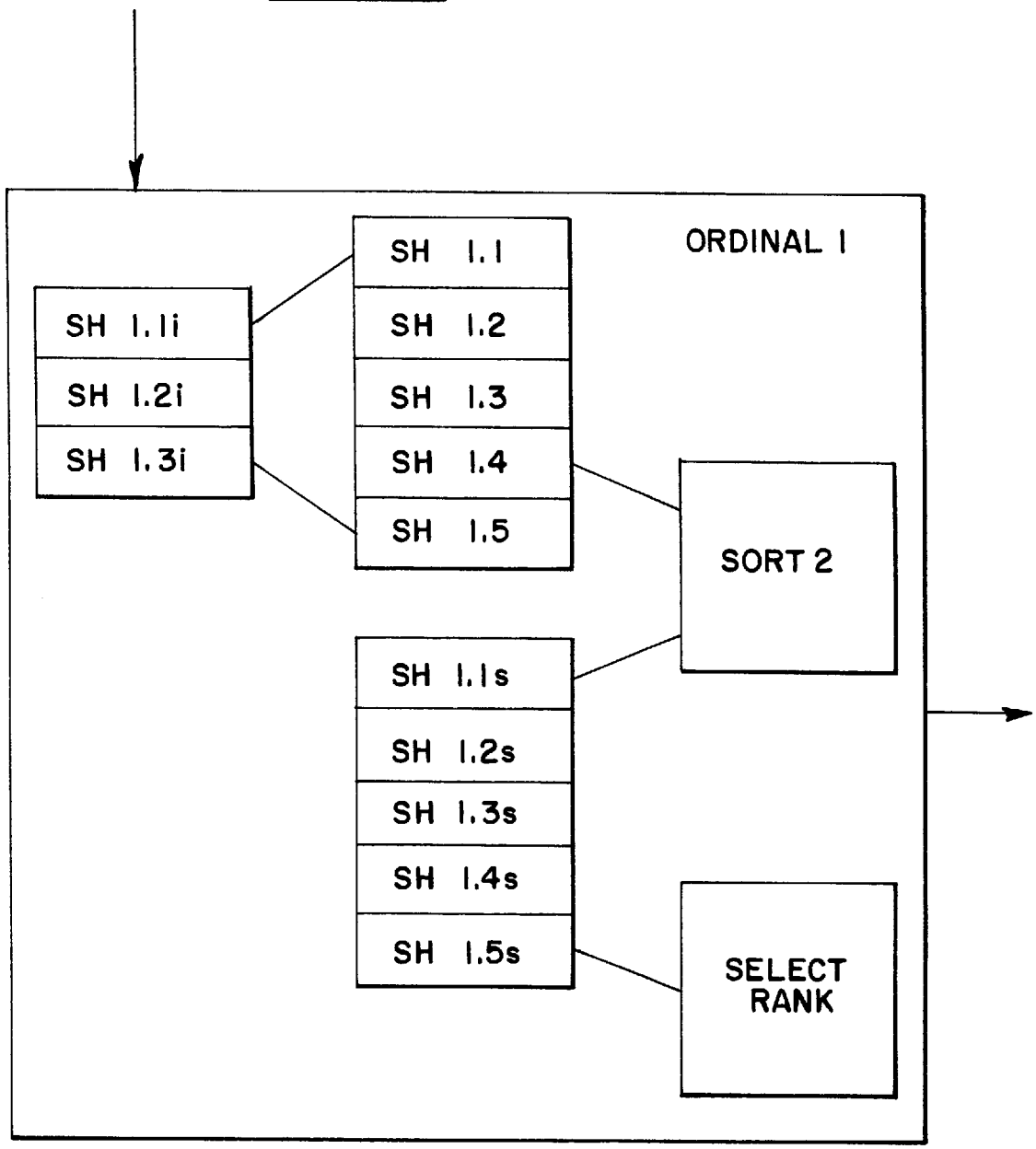

FIG. 1, previously described shows a known weighted median filter circuit hitherto employed with larger window size, for achieving noise reduction.

Figure 2:
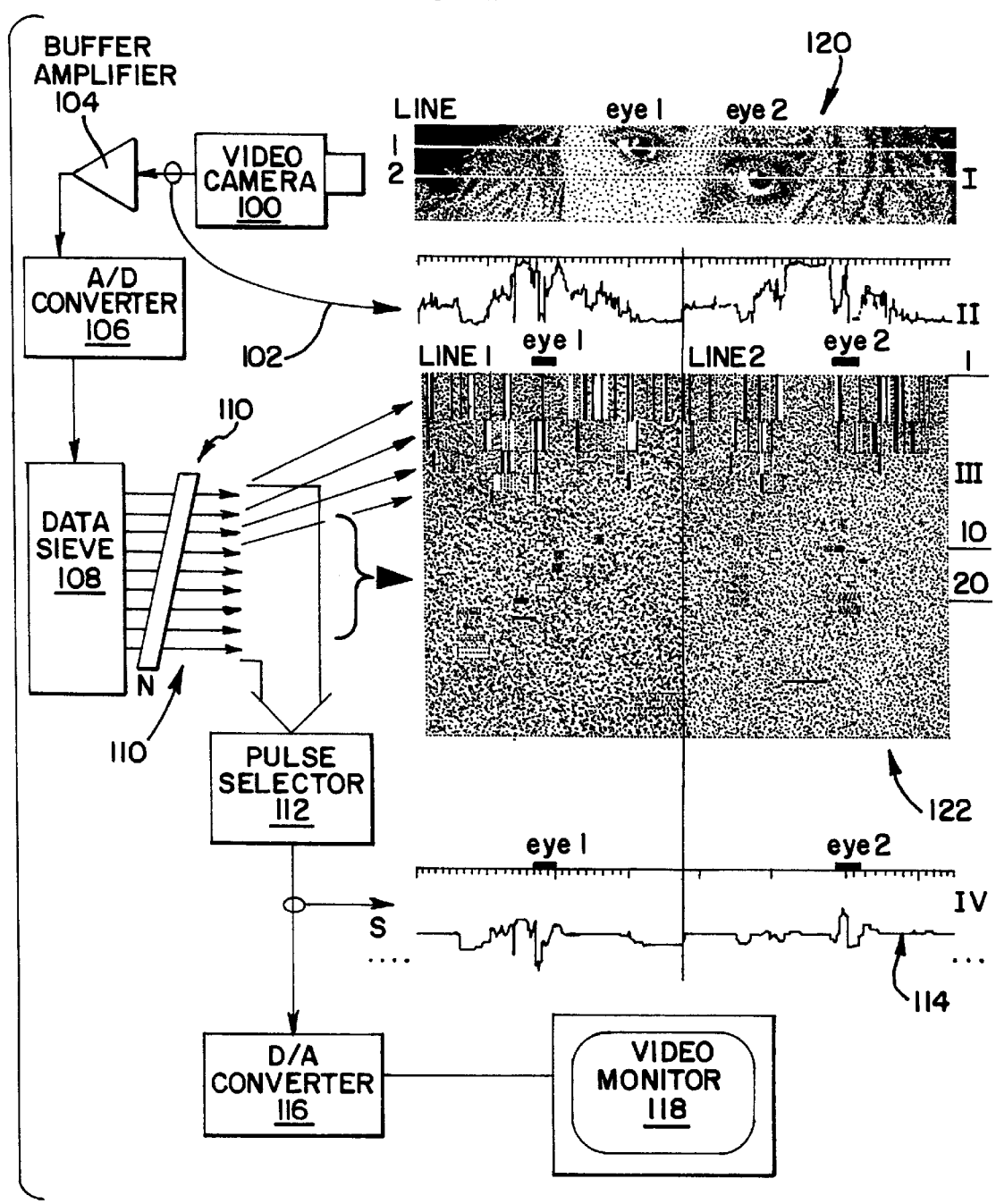

Referring to FIG. 2, there is depicted a video camera 100 supplying an analogue signal 102 through a buffer amplifier 104 and an A/D converter 106 to a datasieve 108. The datasieve comprises a succession of ordinal value filters of integrally increasing value, providing M bandpass outputs 110, one from each stage. Whilst the A/D converter is preferable, it is not essential, as the datasieve 108 could operate on an analogue signal.

The datasieve 108 effectively comprises a pulse width discriminator of M stages, the output of each stage being subtracted from its input to produce a bandpass output which contains pulses of width unique to that stage. Thus, the datasieve decomposes the input signal into component pulses according to their widths.

The M outputs are taken to a pulse selector 112, which selects a predetermined subset of the pulses arising at its multiple inputs and adds them together to produce an output 114 containing only data pulses determined by the selection.

The signal 114 is passed through a D/A converter 116 to a video monitor 118, which displays an image synthesised by the pulse selector and so contains only those features of the input signal selected by the pulse selector 112.

On the right hand side of FIG. 2, part of the original image 120 is shown, white lines highlighting the two scan lines which produce the analogue signal shown at 102. Below this, the scan lines are shown at 122 broken down into a set of constituent pulses of different widths. Amplitude is shown by intensity, pulse width is plotted logarithmically along the vertical axis and the horizontal axis represents time. The output 114 more specifically shows the result of selecting the patterns of pulses which represent the eyes of the subject in the image 120 and recombining to form an amplitude modulated video signal. The unwanted (non-eye) signals are substantially attenuated.

Figure 3:
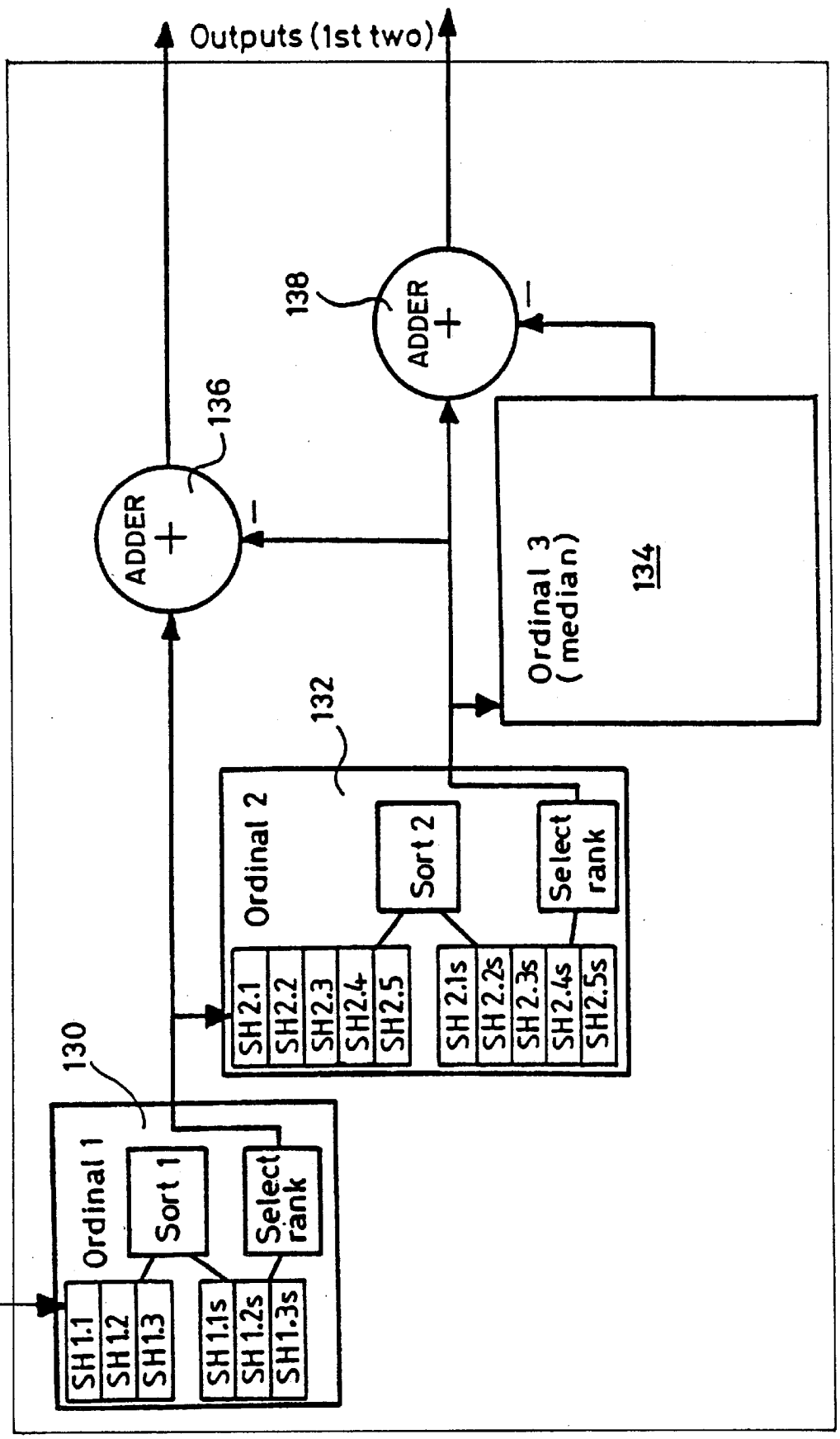
FIG. 3 is a circuit diagram of the system.
Figure 4:
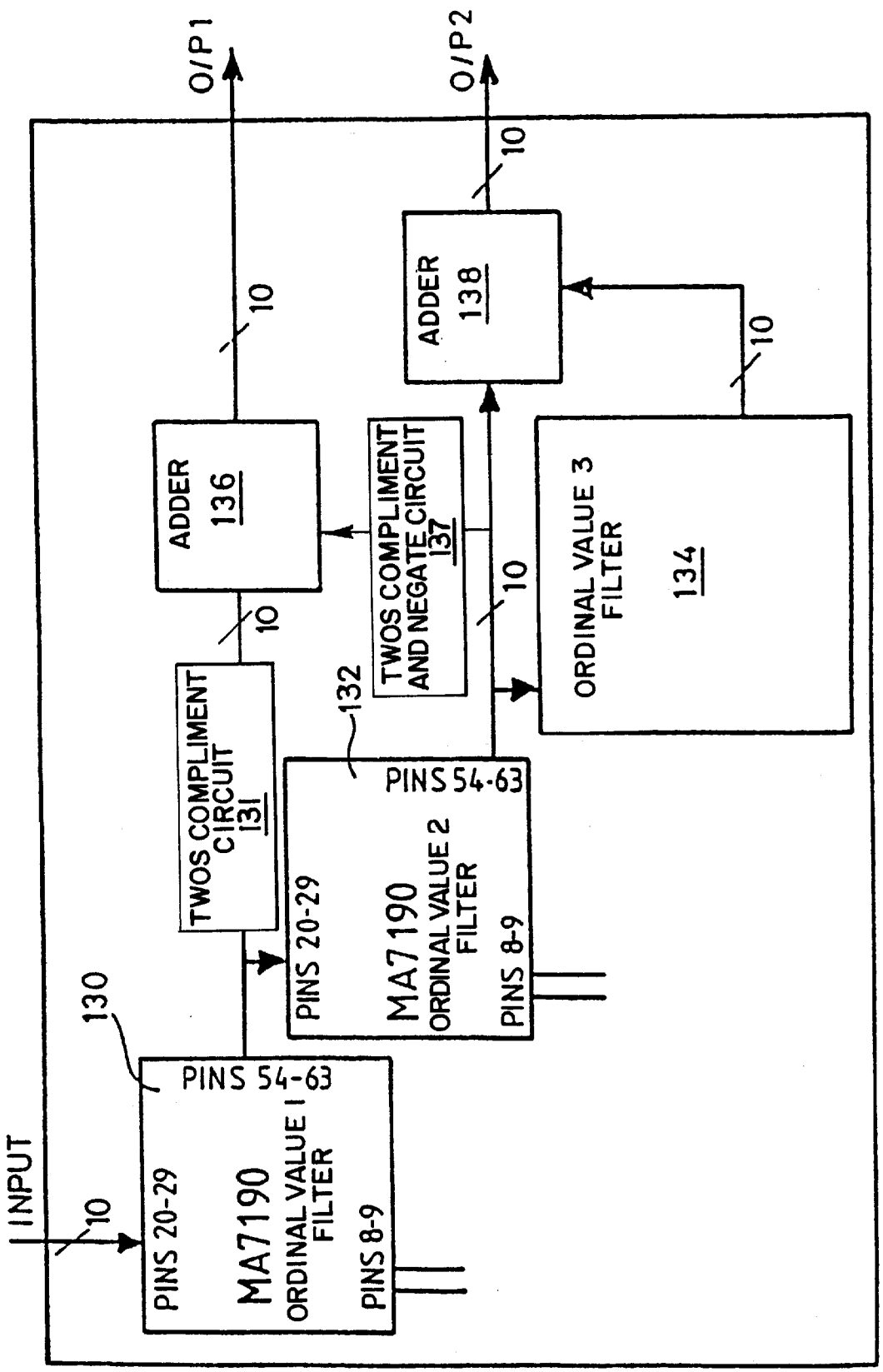
FIG. 4 shows a practical embodiment of the circuit.

The circuit diagram of FIG. 3 exemplifies the system of FIG. 2, whilst FIG. 4 illustrates a practical realisation of the circuit. In these two figures, reference 130 denotes an ordinal value 1 filter, reference 132 an ordinal value 2 filter and reference 134 an ordinal value 3 filter. Ordinal value 3 filter may be a median filter or some other rank filter (the MA 7190 is, for example, able to find any rank), or some combination of rank filters. Filters of ordinal value 4, 5 et seq follow, but are not depicted. Box 131 represents a "twos compliment" circuit. Box 137 represents a "twos compliment and negate" circuit. Adders 136, 138 etc. provide outputs to the pulse selector, full details not shown.

In the practical circuit of FIG. 4, pins 8 and 9 of each filter 130, 132 etc. connect to a central bus. For filter 130, the window is set to 3 and the rank to 2; for filter 132 the window is set to 5 and the rank to 3.

FIGS. 5 to 7 show a modified system in analogous manner, applied to the output 140 of a photomultiplier 142. However, in this embodiment, pulse selection and adding is effected within the datasieve 144, which constitutes a pulse width discriminator with M stages directly providing an output 146 without any, or at least with many fewer, short term pulses or impulses which are unwanted in the final output 148 produced by signal analyser 150.

The photomultiplier 142 is shown providing an output 140 obtained by monitoring the fluorescence of a flow cytometer. This output 140 clearly comprises a basic wanted signal which can be represented as a series of pulses longer than M samples, together with random uncorrelated noise signals of short duration. The cleaned output at 148 is equally clear. Typically, this output contains only pulses of duration greater than 20 data samples.

In more detail, FIG. 5 shows photomultiplier monitoring, e.g. fluorescence of cells in a flow cytometer at 142. The output signal 140 represents an underlying (wanted) signal that can be represented as a sequence of pulses longer than N samples, and (unwanted) random uncorrelated noise that is represented as pulses shorter than N samples in duration. Reference 141 denotes a buffer amplifier, and 143 an analogue to digital converter (most but not all datasieve and pulse selectors will work with digital data). The datasieve pulse width discriminator 144 has a total of N stages, the output 148 of which represents the underlying (wanted) signal without any (or many fewer) short term pulses or impulses. The signal analyser 150 further analyses the underlying (wanted) signal that has been cleaned by the datasieve.

On the right hand side of the figure, there is shown:

I) Digitised signal from the photomultiplier.

II) The wanted signal 148. It consists of all pulses of greater duration than 5 samples. The shorter pulses (unwanted noise) have been severely attenuated, and the edge location, sharpness and pulse widths are better preserved by the datasieve.

III) The inferior result of standard median filtering, and

IV) The inferior result of filtering through a linear Gaussian filter bank. It does not discriminate pulses very well despite being the optimal F.I.R. filter for localising frequency and scale.

It is again to be noted that the illustrated A/D converter 143 is not essential.

The circuit diagram of FIG. 6 and the practical realisation of FIG. 7 will be clear without detailed description, by analogy with the description of FIGS. 2 and 4. In this case, however, the required output is provided by the output of the final filter of the datasieve. Pulse selection is effectively incorporated within the datasieve.

In another aspect, the present invention concerns a pattern recognition system that depends upon an alternative, general purpose, multiscale decomposition, namely the datasieve. It is used as item 200 in FIG. 7 and is designed specifically to yield multiscale primitives that are suitable for pattern recognition. The design commences thresholding operations at the initial decomposition stage. Thus, the datasieve 200 is appropriate for isolating and locating the position of objects with sharp edges arising from non-linear events, because there is an intrinsic binding between the scale of objects and their edges. A typical example is the image due to one object partially occluding another. It can represent structural information in a way that is independent of spatial frequency, has different uncertainty trade-offs, and can be used for scale, position and contrast independent pattern recognition.

FIG. 8 shows the outline of a typical image analysis system. The decomposition by scale of the signal 202 is conventionally performed through a linear process device. However, in accordance with this invention, the datasieve structure 200 is used. The two are pin compatible and so standard edge finding 204, classification 206 and thresholding 208, 210 processing of the intermediate signal primitives 212 can be performed. However, the present invention also concerns unconventional approaches to steps 204 to 210 that the datasieve enables.

It is important to note that these non-linear ordinal filters are neither commutative nor associative and so different arrangements of sub-filters yield different overall results. This difference from linear filters is fundamental for it means that different arrangements (structures) of filters are functionally distinct.

The cascade structure introduced by the datasieve in which ordinal filters of increasing window width are serially coupled together produces a distinctive and useful result. It is important to emphasise that it is the cascade structure of a series of increasing scale ordinal or rank filters that is important, not the particular ordinal filter used at each stage in the series. This arrangement has advantages over alternatives, because it is found that successive stages of a median (or other combination of rank) filter cascade eliminate the distortions introduced by a single long filter. This is a problem encountered when using, for example, pairs of long median filters required to discriminate a van from a bush, in U.S. Pat. No. 4,603,430.

The datasieve exploits the well-known property of ordinal (i.e. rank order) filters of simplifying signals whilst preserving edges (see for example U.S. Pat. Nos. 4,441,165, 4,439, 840, 4,506,974). This characteristic has been recognised since the introduction of the closely related binary morphological filters in the 1950s although it was not until the mid-1980s that these filters were extended to grey scales by using sequences of max and min operations. In the late 1970s a separate line of research developed around median filters, but recently the two approaches have converged with the development of stack filter theory, umbrae and finally the datasieve.

Figure 9A:
Figure 9B:
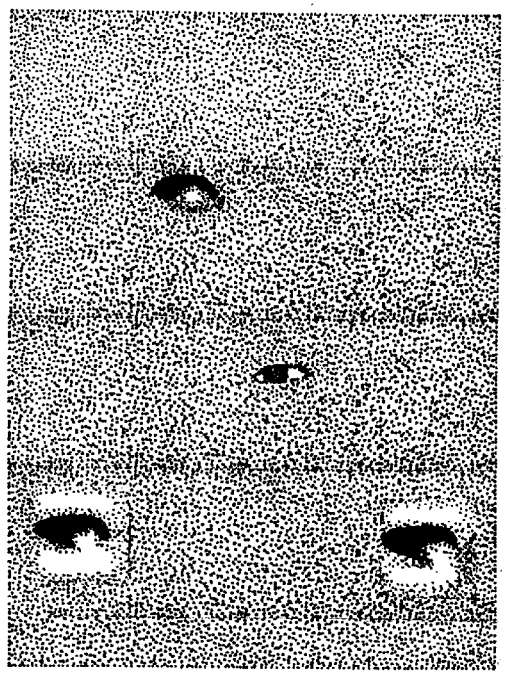
Figure 10A:
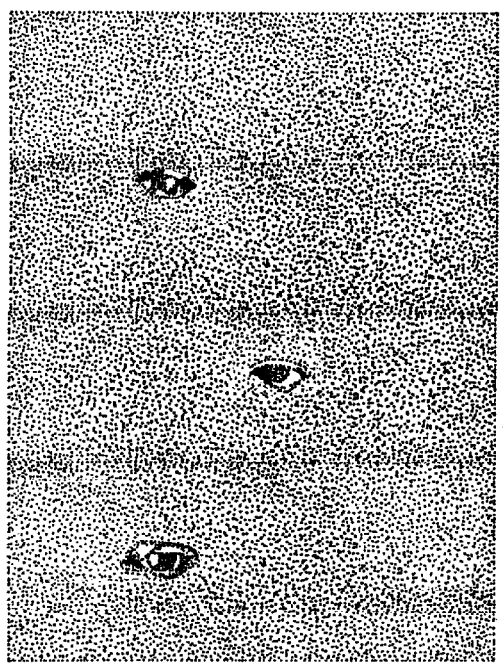

The systems described herein represent pattern recognition based on the primitives obtained from the datasieve. The information in the primitives derived from the datasieve has been termed the granularity, granules or rects. It is found that the granularity can be used directly to simplify signals and to recognise patterns in both one and two dimensions. The advantages of doing this are illustrated in FIG. 10A, which clearly shows that the right eyes can be located in the test image and the remainder of the images rejected. The figure shows the result of applying the datasieve to the signal granules 200 (FIG. 8) obtained from the image in FIG. 9A. As in the case of linear processing (FIG. 9B) the mask is derived from the eye at the centre. The improved result achieved by use of the datasieve (FIG. 10A) is clearly better than the result obtained by linear processing (FIG. 9B).

Figure 10B:

In another application of the method, a means of recognising elements of an image that are visually important is produced. This may be used for image compression. The properties of granules are exploited to form an information reduced image as illustrated in FIG. 10B. This shows the output from a lowpass 2D datasieve (circular mask, order 10, i.e. from the tenth stage of the datasieve) to which only the largest 10% of granules obtained from the first 9 stages have been added. The middle region of the image is to be compared with the middle of FIG. 9A. Adding 100% of granules would result in a perfect reconstruction.

With regard to one dimensional recognition at single scale using a matched datasieve, the granularity (signal primitives obtained by datasieving) of a one-dimensional (1D) target signal can be used to design a circuit, based on a datasieve, that discriminates a target from background signals. It is called a matched datasieve. The method requires the signature of the target in terms of its granularity; in other words the target is datasieved to obtain its granularity. In the 1D case each granule is described by three parameters: its position x, its amplitude a, and its scale or mesh m. One of the granules, usually the first, is then designated to be the reference granule and its value of x is subtracted from each x. As a result all x parameters become offsets relative to the reference granule.

In one implementation of the matched sieve the process of obtaining the target parameters takes place before designing the matched sieve itself. In another implementation the target parameters are refined, using standard adaptive filter methods that incorporate an error measure and negative feedback.

The parameters are then used to design or configure a datasieve matched to the target. This is achieved by a granule (in 1D a pulse) selector that only passes those patterns of granules the parameters of which match the target parameters within controlled limits. The role of the granules selector in a 1D matched sieve is shown in FIG. 11.

FIG. 11 shows at (I) part of original image, wherein white lines highlight the two scan lines used for the worked example. This is then sampled using a video camera 220 generating an analogue line scanned image (II). A buffer amplifier 222 feeds an analogue to digital converter 224 (most but not all datasieve and pulse selectors will work with digital data), and the digitised signal is then datasieved at 226 to a total of M stages. The output of each stage is subtracted from its input to produce bandpass output that contains granules of scale unique to that stage, i.e. it decomposes the input signal to component granules according to their widths and two dimensional geometry. The parallel outputs are then passed to a granule selector 228 which selects a subset of those granules arriving at its inputs and adds them together to produce an output. The result (III) shows the result of selecting patterns of granules that represent the eyes and recombining to form an amplitude modulated video signal. Unwanted (non-eye) information is substantially reduced and is then passed through a digital to analogue converter 230 (if 226 and 228 are operating on digitised data) and displayed on a video monitor 232 that displays an image that has been synthesised by the pulse selector and so contains only those features of the input that match the pattern of pulses selected by selector 228.

Reference 234 indicates that the datasieve 226 provides M bandpass outputs, one for each stage, to the selector 228. This selector (delivering different order granule signals 236)

in a learn mode, stores granules (g-target) and subsequently at 238 match mode ANDs g-target and incoming granules (g-image) to provide outputs only if g-target is exceeded.

Also in accordance with the present invention, FIG. 12 serves to illustrate three improved methods for obtaining two-dimensional (2D) image primitives using 1D datasieves. In one implementation, at each stage of a datasieve the output of the previous stage 250 is scanned at several angles a and the several sequences of samples ordinal filtered with a window appropriate to the stage in the datasieve. The several resulting images are then either ORed together at 252 or ANDed together at 254 to form the output image at that stage 256. In another implementation the image at each stage 250 is first scanned at one angle a, and the sequence of samples ordinal filtered with a window appropriate to the stage in the datasieve. Then the resulting image is re-scanned at another angle $a_2$ and the sequence of samples ordinal filtered again with a window appropriate to the stage in the datasieve. In other words the operations are carried out in series as indicated at 258. This is repeated for all angles and the final output image 256 is the output of that stage.

A more general case of pattern recognition using a matched sieve would handle multidimensional signals, for example, images. FIG. 13 shows how this can be achieved and FIG. 14 shows a circuit to implement it. In stage 260 (FIG. 13) the image 262 (shown as the image at the bottom of the pile of object 263) is decomposed to a series of images of increasing scale. This is effected using a datasieve. The next step is to take the difference between pairs at increasing scale. The difference images contain scale and geometric information associated with objects in the image, which is the granularity, g. The difference images are shown with scale increasing $g^1_{image}, g^2_{image}, g^3_{image} \ldots$ The granularity of the object is also shown at each scale.

The next step 264 is to decompose the target (shown as an image 265 at the bottom) to a series of images of increasing scale. This is performed the same way as with the image. Differences are taken to form $g^1_{target}, g^2_{target}, g^3_{target} \ldots$ and all parameters of non-zero values are stored in g target. In the case of 2D images, the result is a 3D mask. One of the granules in the mask becomes the reference and all offsets x are made relative to the reference granule. In a similar manner all m and offsets x are scaled according to the parameter m of the reference granule. In the final step 266, the target mask is passed through an image box in the x, y, z planes (2D images have three planes, 1D have two planes namely x position and scale z), scaling as appropriate. At each position, the target x, y, z is scaled according to the value z of the reference element. Then every element in the target box is ANDed with the associated element in the image box to increment a counter representing the numbers that are non-zero at each z (order). If more than the threshold number of elements are non-zero, then a function of each matching element is outputted to the associated output granularity, g-output, and the elements of g-outputs are added at each x, y position to form the output image. An example of result from such a matched datasieve is shown in FIG. 10 left panel.

FIG. 14 shows a circuit for a matched datasieve. The signal at position x, y of, for example, an image is input 300 (which corresponds to the input 226 in FIG. 11) and three possible outputs are available. Output 302 is a lowpass datasieved result, output 304 is a measure of the quality of match at the particular point in the input and output 306 is the value of the matched sieve output at position x, y. Output 306 corresponds to the input to the 230 in FIG. 11.

308 is a standard datasieve, typically using a circular mask and median filter at each stage, as previously described. It comprises three main elements at each stage. 310 is the ordinal filter, and 312 is a delay line to compensate for the delay introduced by 310. 314 is an adder that finds the difference between the input 300 to 310 and its output. There are M difference signals 316, one corresponding to each scale or level in the datasieve. One or more may be combined together.

The circuit comprising 318, 320, 322, 324 provides a means of determining and storing the parameters of the target. When item 326 is set, the signal 316 is routed to set of buffers 324 where the granule values are stored whenever 326 is cleared. Signal 338 is a granularity image of the target (as seen in 264 in FIG. 13). The set of buffers 320 represent a delay line with as many elements as is necessary to encompass the target. It will be a two-dimensional array if the target is an image. The parameters of some but not all the granules is stored in 324, selection being made by the thresholding devices 322. Elements 320, 322, 324 together represent an example of a perceptron.

The outputs from 324 are used to gate outputs from another set of threshold devices 330. Elements 332 and 330 are similar to 320, 322 in that they store a spatial sequence of samples, the values of which are thresholded to remove unwanted small granules. Signal 334 is a granularity image as seen in 260 in FIG. 13. 336 is a buffer that is enabled by signal 338. It is this step that selects the set of granules in the image according to the target pattern stored in 324.

In order to determine the quality of match at the particular scale m on the output from 308, the outputs of 336 are summed at 340 and the result thresholded at 342 either locally at a particular scale m or collectively over all m. If the signal exceeds the threshold, a gating signal 344 is used to gate the outputs 346 by enabling buffer 348. The selected granules 350 at each x, y, m are then summed at 352 and the intensity at that position is output 306.

An alternative output at each x, y is a measure of the total match at that point and this is obtained by summing at 344 for all M scales.

An element of the full circuit is illustrated but it is understood that similar circuits exist for handling each stage of the datasieve. It is also understood that a steering circuit exists for applying the scaled parameters 354, 356 to each of the scales m.

In order to recognise objects that are a mirror image of the target, means of switching the order of output 328 is provided.

If all elements of buffer 336 are enabled (so ignoring the target) and the selection based on 344 is also ignored, the device becomes a means of selecting component granules according to their amplitude by means of the threshold devices 330. The result, when combined with a lowpass signal, is a simplified representation of the original signal. For example, FIG. 10B, shows an image of Lenna that has been simplified in this manner.

The key property of datasieves that distinguishes decomposition by this route, as opposed to conventional methods, is the way sharp edged objects are not spread to many scales. The less the information is spread, the fewer target parameters need to be stored. Conversely, conventional linear signal processing methods do not spread smoothly contrasted objects to many spatial channels. It is, therefore, desirable to use whichever decomposition, linear or datasieve, that yields the least spread of information over different scales to form a hybrid filter.

The advantages of switching between non-linear and linear methods, although not with respect to a datasieve, has been published, e.g. "The scheme is based on a combination of linear and non-linear filters and a decision structure. The decision structure is designed in such a way that it switches between the linear and non-linear filters depending on the presence of a signal component which could give rise to serious aliasing artefacts. In this way, filtering with the elimination of both blurring and aliasing is achieved." (Also see FIG. 3 in the paper by Defee, I., Soininen, R., and Neuvo, Y. "Detail-preserving filters with improved lowpass characteristics", Signal Processing, Elsevier, pp 1157–1160 (1992)).

However, this prior proposal does not make use of granularity. Instead, an ad hoc method is employed for identifying outliers, which results in unreliable, pixel by pixel, switching. A more reliable method is identified below.

A measure of the spread of information over the different scales can be obtained by finding the variance (power) of output 346 (FIG. 14) over all the m. FIG. 15(*a*) shows a circuit which compares two signals input at 401 and selects the appropriate datasieve, or linear matched filter, depending on the result. Item 400 produces a datasieve decomposition in terms of granularity. Item 402 produces a linear decomposition in terms of spatial wavelength related parameters. These outputs, which may be equivalent to outputs 304 and 306 in FIG. 14, are connected to items 404, 406 respectively. The inputs to 408 represent the variance (power) associated with the distribution of granularities (wavelengths) associated with outputs 350 in FIG. 14 and the equivalent measure from the linear decomposition. 408 then either gates 400 to the output 410 using 404 or respectively gates 402 to the output using 406.

It is also possible for a signal to contain both smooth contrasted and sharp edged objects, in which case selectivity of a system can be improved by combining the linear and non-linear decompositions. FIG. 15(*b*) shows a suitable circuit. A datasieve non-linear decomposition is performed by 420 and a linear decomposition by 422. In this case these steps may include an element of matching. The outputs, for example, might be such as FIG. 9B and FIG. 10A. Component 424 then either ANDs the two results or ORs them together to produce output 426.

A fast datasieve employing run length coding is now described with reference to FIGS. 16 to 18.

The principle of operation of a fast one-dimensional datasieve is now described by means of a pseudo-code program for one-dimensional decomposition. It should be understood that faster hardware implementations are described later.

Start:
1) a) Runlength code the data as a series of triples (vectors) r=(v, n, s), where v is the value of the run, n is the number of samples within the run and the flag s signifies whether the run is part of a monotone or extrema let i be the index into the current run-length:
  b) Monitor si
   if ($v_{i-1} < v_i < v_{i+1}$) then $s_i$=1 monotonic upwards
   if ($v_{i-1} > v_i > v_{i+1}$) then $s_i$=2 monotonic downwards
   if ($v_{i-1} < v_i > v_{i+1}$) then $s_1$=−1 maximum extremum, hill top
   if ($v_{i-1} > v_i < v_{i+1}$) then $s_i$=−2 minimum extremum, valley floor
  Also, record the smallest value of n, when $s_i$<0, as min n.
2) Set the mesh of the current stage in the datasieve to min_n, i.e. Let m=min_n 3) If (min_n<=m)
Begin:
  for (i=start to i=end of data)
  begin
   If ($s_i$>0 or n>m) copy to output else if (median or root median) filter the data m values before to m values after the extremum, a total 2m+1 samples. Whenever the root median filter is being implemented, there is no need to use a conventional sort. It is enough to choose the largest of $v_{i-1}$ and $v_{i+1}$ when $s_i$=−1 or the smallest of $v_{i-1}$ and $v_{i+1}$ when $s_i$=−2.
   else if (alpha or beta filter) either filter the hill-tops, to implement a min followed by a max. operation, or the valley-floors, to implement a max followed by a min operation.
  To perform a min followed by max, choose the largest of $v_{i-1}$ and $v_{i+1}$ when s=−1 and to perform a max followed by min choose the smallest of $v_{i-1}$ and $v_{i+1}$ when $s_i$=−2.
  update min n.
  end
4) If (min_n>maximum mesh required or min_n>=N the number of samples) then finish
  else If (min_n=m) go to 3 (this will not happen at the root of median or when applying an alpha or beta datasieve)
  go to 2
Finish.

A hardware implementation is shown in FIGS. 16 to 18 and is described in detail, later.

In the case of two-dimensional or multi-dimensional signals, the values of the flag s have to be extended to indicate two-dimensional monotones and the presence or not of discontinuities in the signal in more than one direction. However, the technique of flagging regions for which no computation is required so restricting the amount of processing that has to be carried out, remains equally applicable.

A 2D datasieve algorithm is now described can reduce the circuit complexity significantly. It takes the form of a simple two dimensional square filter that exploits the property of the datasieve method that results in the signal, for example a two dimensional image, becoming simpler as it passes through the stages in the datasieve.

1) Transfer image horizontal scan line by line to buffer H and again vertical scan line by line to V, they are indexed using j and i respectively. Runlength code the rows of H and volumns of V and transfer the result to buffer RH and RV respectively, these buffers are indexed using rj and ri.
2) Load buffer Hs at each position ri according to the following rules
  if ($RH_{ri-1} < RH_{ri} < RH_{ri+1}$) then $Hs_{ri}$=1 monotonic upwards
  else if ($RH_{ri-1} > RH_{ri} > RH_{ri+1}$) then $Hs_{ri}$=2 monotonic downwards
  else $Hs_{ri}$=0
  Likewise for $Vs_{ri}$ that depends on V.
3) Runlength code the flags Vs and Hs to form RVs and RHs respectively.
4) Starting at the top left position in the image, i,j but allowing for the window and that other than at the first stage of the datasieve, j will have been incremented.
5) Let variable Top be the range of indexes that access the top row of the image elements within the window centered at position i,j. Likewise let variable Left be the range of indexes that access the left column of the image elements within the window centered at position i,j.
6) Let the minimum i in RH indexed by Left, for which elements of RH are the same and for which elements of RV indexed by Top at each position i are all the same, be i_min a let the minimum i in RHs indexed by Left, for which element of RHs are the same and for which elements of RVs indexed by Top at each position are all the same and the image within the window is monotone in all other directions, be i_minb let i_min=min of i_mina and i_minb If (i_min>current position i and neither RV nor RH start runs at this position)

then for i=i to i_min transfer the input elements of V and H to the equivalent output buffers else filter the image at position i,j 7) Update flags Vs, RVs, Hs, RHs 8) If i has reached the end of the line increment to the next line by incrementing j and go to 5.

9) If i and j have reached the end of the image and datasieve has not finished, then increase the size of the window and go to 1.

The result is that although later stages of the datasieve, have large windows the signal contains large regions that are either flat or monotone in 2D (because of the datasieve circuits). Hence the proposed circuit will be faster since only the top and left edges of the window proportional to m) have to be processed complexity proportional to scale m in contrast to the standard approach in which all elements in the window have to be considered separately (complexity proportional to m squared). The approach is not confined to square filters or to rectangular lattice images.

One possible hardware implementation is of the one dimensional circuit shown in FIGS. 16 to 18.

FIG. 16 shows the outline of the fast datasieve circuit. In this example, the input signal is assumed to be runlength coded. The runlength coded signal 500 is applied to a combined gate and buffer 502. This contains an input buffer and a computation buffer. The combined gate and buffer 502 is connected through a control bus 504 to a controller 506. The controller instructs 502 to transfer a new run or sequence of runs from the input buffer to the computation buffer. The content of the computation buffer is then transferred to the rank operator unit 510. This performs a single stage of smoothing using scale parameter m=1. The result 512 is passed to an output gate 514. The routing of the signal achieved by 514 depends on the type of datasieve being implemented. If it is an alpha or beta datasieve then each stage of the fast datasieve performs two rank filtering steps, either a minimum then maximum or a max then min. Consequently, signal 516 is either routed to a filtering step of the appropriate type before being passed to the next stage for which m=2, or it is recycled through 502 and reprocessed with the alternate operation before being passed to the next stage. If the datasieve to be implemented is based on root medians the output of 514 is either routed to sufficient further stages of 510 to assure that the minimum extremum runlength is greater than m samples long, or is recycled back to 502 whereupon the segment of signal is repeatedly processed until the minimum extremum runlength condition is met. The control system 504, 506 provides overall supervision of the circuitry. This is assured in a finite number of iterations. During these sieving operations 502 buffers the input signal. The overall output of the datasieve stage 516 is finally passed to the next datasieve stage for which m=2. An alternative, bandpass, output 518 is provided by a circuit 520 which, when necessary, expands the runlength coded input 500 and the output signal 516, and takes the difference.

It is not essential for the signal to be or remain runlength coded. Indeed there may be advantages in implementing the whole circuit as an analogue filter, using buffers created from analogue sample and holds.

Using this approach it is possible to produce either a finite segment length fast datasieve transform (alternatively known as the fast sieve transform), which operates on a single block of data, or a continuous, one sample in-one sample out sieve that could be analogue in and analogue out.

It should be noted that in one dimension alpha and beta filters can be implemented directly using a predictable number of rank order operators because the output of each stage is idempotent in one pass. In the case of a root median a number of passes are required to find the root. However, this does not lead to a large increase in the number of rank operations at 510 required for a given sieve. This is because multiple passes at a given m are only required if there is an oscillation of scale m and an oscillation at one scale necessarily reduces the number of oscillations at other scales. In one example of a circuit that takes advantage of this, there are a number of stages each such as indicated in FIG. 16. Each stage median filters the signal with an m that is dictated by the minimum runlength present in the signal at the output of the previous stage. Consequently, if a median filtering operation at scale m does not increase the minimum runlength present in the signal, so the next stage repeats the median filtering operation at the same scale. This is repeated until the desired m is reached. It is found that the maximum number of stages required is finite and workable.

FIG. 17 shows a circuit 530 for finding the extrema. The input 532 is assumed to be runlength coded, although it need not be. Let the number of samples in a run be n and the amplitude of the run be v and the runlength structures, or positions on a stack, or the sequences that form runs, be indexed by i as indicated at 534. Segments of the signal that are part of an increasing monotone, i.e. $v_{i-1}<v_i<v_{i+1}$, are detected by the comparators 536 and the AND gate 538 and are signalled by 540 becoming logically true. Likewise those segments that are part of a decreasing monotone, i.e. $v_{i-1}>v_i>v_{i+1}$, are detected by the comparators 536 and the NOR gate 542 and are signalled by 544 becoming logically true. Extrema, i.e. maxima or hill tops $v_{i-1}<v_i>v_{i+1}$, and minima or valley bottoms, $v_{i-1}>v_i<v_{i+1}$, are detected by the comparators 536 and the EOR gate 546 and are signalled by 548 becoming logically true. (In the case of alpha or beta filters it is necessary to distinguish hill tops from valley bottoms, and this can be achieved by further simple logic gates.)

FIG. 18 shows the rank filtering step 550 of a fast datasieve. The input 552 is assumed to be runlength coded. Local extrema, the hill tops and valley floors are flagged using the circuit 554 (detailed in FIG. 17). The output of 554, namely 556, is used to control a gate 558. The gate 558 either routes 552 or 560 to the buffer output 562. 558 routes 552 to 562 whenever the 552 is monotonic or the extremum has a run of greater than m samples. Otherwise it routes 560 to buffer 562. When it routes 560 to 562 it also controls the addressing of buffers 564 and 562 such that 560 is correctly positioned in the output buffer and the correct output 566 is selected. Circuits 534 and 536 from FIG. 17 are also shown in FIG. 18.

I claim:

1. A method of pulse analysis applied to a signal conglomerate represented as a set of data samples in order to remove unwanted signals from wanted signals, comprising the following steps of:

a) ordinal value filtering at least a selected part of the signal conglomerate with a succession of filters of window sizes increasing from N (being less than M) up to M, an input to each successive filter being formed from an output of a previous filter;

b) subtracting a current filter output from the previous filter output for said succession of filters to obtain bandpass outputs, known as granularities, consisting of strings of data points which contain strings of zero-valued data points, known as zero segments, and strings of non-zero-valued data points, known as non-zero segments or granules;

c) selecting a subset of the granularities; and d) adding together granularities within said subset to produce an output signal containing the granules in said subset.

2. A method according to claim 1, in which said selected subset of granularities contains only granules containing not less than a predetermined number of data points.

3. A method according to claim 1, in which, where the said conglomerate is one dimensional and individual data samples of said signal conglomerate are spaced by distance and/or time, said selected subset of granularities comprises groups of granularities, corresponding to successive filter outputs.

4. A method according to claim 1, in which said signal conglomerate is two dimensional, said selected subset of granularities comprises groups of successive similar arrays of granularities, whereby each group of arrays includes signals from at least two such arrays.

5. A method according to claim 1, in which:

said signal conglomerate is of digital form; and including the step of processing said digital signal conglomerate before said ordinal value filtering as to reduce the time required for ordinal value filtering of the digital signal conglomerate.

6. A method according to claim 1, in which at least part of the ordinal value filtering step is carried out by weighted median filtering.

7. A method according to claim 1, wherein at least part of the ordinal value filtering step is carried out by a forced root filter.

8. A method according to claim 1, wherein at least part of the ordinal value filtering step is carried out by root median filter.

9. A method according to claim 1, wherein at least part of the ordinal value filtering step is carried out by combinations of max and min filters.

10. A method of pulse analysis according to claim 1, further comprising forming an output of a hybrid filter by combining said output signal and a linear multiscale decomposition.

11. A method of pulse analysis applied to a signal conglomerate including:

flagging segments of the signal conglomerate which are extrema;

identifying those segments which require processing by the length of the flagged segments; and processing the identified segments by ordinal value filtering where the identified segments are filtered with a succession of filtering stages of increasing window sizes, with an input to each successive filtering stage being formed from an output of a previous filtering stage.

12. A method according to claim 11, wherein said processing of the identified segments by ordinal value filters includes ordinal value filtering said identified segments with extrema of maxima and minima for at least one of the filtering stages.

13. A method according to claim 11, wherein said processing of the identified segments by ordinal value filters includes ordinal value filtering said identified segments separately for minima and maxima.

14. A method according to claim 11, wherein said processing of the identified segments by ordinal value filters includes ordinal value filtering said identified segments with only maxima or minima for at least one of the filtering stages.

15. A method according to claim 11, in which said processing of said identified segments occurs so that the processed value of each identified segment depends only on the length of the identified segment and the lengths of adjacent identified samples.

16. A method according to claim 11, further comprising run length coding the identified segments prior to each successive filtering stage.

17. A method according to claim 11, further comprising flagging upward and downward monotonic regions, and using the flagged regions to limit the extent of said processing.

18. A method of pulse analysis applied to a signal conglomerate including an ordinal value filtering step wherein at least a selected part of the signal conglomerate is filtered with a succession of ordinal value filters of increasing window sizes, an input to each successive ordinal value filter is formed from the output of the previous ordinal value filter, and at least one of the ordinal value filters is a stack filter having stages which contain positive boolean logic for reducing the amount of filtering.

19. A method according to claim 18, further comprising the steps of:

a) threshold decomposing the signal conglomerate to binary signals;

b) at said ordinal value filtering step, filtering the binary signals independently using boolean logic; and c) adding the ordinal value filter outputs to form a greyscale filtered signal.

20. A method according to claim 18, in which said ordinal value filtering step uses weighted median filters.

21. A method of pattern recognition which comprises the steps of:

a successive ordinal value filtering step to filter data which describes a field containing a plurality of objects using a succession of filters of increasing window sizes, whereby an input to each successive filter is formed from the output of a previous filter so as to produce resulting data;

a matching step involving matching or comparing said resulting data with data describing one particular object which is to be identified according to shape and/or pattern and/or size from the said plurality of objects; and a generation step wherein an output signal containing data relating only to objects having the characteristics of said particular object is generated.

22. A method as claimed in claim 21, in which said matching step is based on only a subset of the resulting data.

23. A method according to claim 21, in which said ordinal value filtering step is carried out using combinations of max and min filters.

24. A method according to claim 21, in which said ordinal value filtering step is carried out using forced root filters.

25. A method according to claim 21, in which said ordinal value filtering step is performed in two dimensions relative to the objects in the field.

26. A method according to claim 21, in which said matching step is based on size.

27. A method according to claim 21, further comprising scanning a field containing a plurality of objects to obtain the data to be filtered.

28. A datasieve for removing unwanted signals from a signal conglomerate comprising:

a succession of ordinal filtering means receiving at least a selected part of said signal conglomerate and filtering said at least a selected part of said signal conglomerate to produce a bandpass filter output, the ordinal filtering means having window lengths increasing from N (less than M) up to M, whereby an input to each successive ordinal filtering means is formed from the output of the previous ordinal filtering means;

selection means for selecting a predetermined subset of bandpass filter outputs from outputs of the succession of ordinal filtering means; and arithmetic means for adding together the signals of the subset to produce an output signal containing only wanted signals selected by the selection means.

29. The use of a datasieve as a picture signal decomposition element in an image analysis system adapted to perform pattern recognition, the datasieve comprising:

a succession of ordinal filtering means receiving at least a selected part of a signal conglomerate and filtering at least a selected part of said signal conglomerate to produce a bandpass filter output, the ordinal filtering means having window lengths increasing from N (less than M) up to M, whereby an input to each successive ordinal filtering means is formed from an output of the previous ordinal filtering means;

selection means for selecting a predetermined subset of bandpass filter outputs from said outputs of the succession of ordinal filtering means; and arithmetic means for adding together the signals of the subset to produce an output signal containing only signals selected by the selection means, where the input to the datasieve is data which describes a field of view containing a plurality of objects.

30. An image analysis system incorporating:

a datasieve comprising: a succession of ordinal filtering means receiving at least a selected part of a signal conglomerate, said filtering said at least a selected part of said signal conglomerate to produce a bandpass filter output, the ordinal filtering means having window lengths increasing from N (less than M) up to M, whereby an input signal to each successive filtering means is formal from the output of the previous filtering means; selection means for selecting a predetermined subset of bandpass filter outputs from outputs of the succession of filtering means; and arithmetic means for adding together the signals of the subset to produce an output signal containing only wanted signals determined by the selection means;

data storage means for storing data relating to a sought-for-feature or object which may exist in a field from which data is derived for presenting to the datasieve;

comparison means for matching or comparing the stored data with the output signal of the datasieve; and selection means to select from the input signal only data having a high degree of match to the data in the data storage means.

31. An image analysis system according to claim 30, wherein:

the comparison means performs matching or comparing by storing the output from some or all of the filtering means of the datasieve in the data storage means, and matching or comparing the stored data with data obtained from the same filtering means of the datasieve from which the stored data have been derived; and further comprising thresholding means to exclude from output signals of the comparison means all output signals which have a given level of match in accordance with a predetermined threshold.

32. A method of image analysis in which:

a data stream representative of a field of view is analyzed to identify one or more images of objects in the field of view by the following steps of:

a) ordinal value filtering at least a selected part of a signal conglomerate with a succession of filters of window sizes increasing from N (being less than M) up to M, an input to each successive filter being formed from an output of a previous filter;

b) subtracting a current filter output from the previous filter output for said succession of filters to obtain bandpass outputs, known as granularities, consisting of strings of data points which contain strings of zero-valued data points, known as zero segments, and strings of non-zero-valued data points, known as non-zero segments or granules;

c) selecting a subset of the granularities;

d) adding together granularities within said subset to produce an output signal containing the granules in said subset; and e) matching said output signal with a target or template of a particular object to be identified.

33. A method according to claim 32, in which matching occurs by ANDing said output signal with the target or template using some or all of the granules in the target or template.

34. A method according to claim 32, further comprising obtaining the granularities as a result of multidimensional decomposition.

35. A method according to claim 32, further comprising obtaining the granularities as a result of one dimensional decomposition of images obtained from a plurality of orientations of the objects in the field of view.

36. A method according to claim 32, including means for switching the order of the granularities to enable a mirror image of one or more objects to be recognized at the matching step.

37. An image analysis system according to claim 30, wherein the comparison means performs matching or comparing by storing differences between successive outputs from the different filtering means of the datasieve in the data storage means, and matching or comparing the stored data with the differences in data obtained from the same filtering means of the datasieve from which the differences in data have been derived; and further comprising thresholding means to exclude from output signals of the comparison means all output signals which have a given level of match in accordance with a predetermined threshold.

38. A method of pulse analysis, comprising the following steps of:

a) ordinal value filtering at least a selected part of a signal conglomerate with a succession of filters of window sizes increasing from N (being less than M) up to M, an input to each successive filter being formed from an output of a previous filter;

b) subtracting a current filter output from the previous filter output for said succession of filters to obtain bandpass outputs, known as granularities, consisting of strings of data points which contain strings of zero-valued data points, known as zero segments, and strings of non-zero-valued data points, known as non-zero segments or granules;

c) selecting a subset of the granularities;

d) adding together granularities within said subset to produce an output signal containing the granules in said subset;

e) selecting the signals passed by the Mth ordinal filter; and f) combining the selected signals with only some of the granules obtained from the preceding steps.

39. The use of a method of pulse analysis comprising the following steps of:

a) ordinal value filtering at least a selected part of a signal conglomerate with a succession of filters of window sizes increasing from N (being less than M) up to M and with the filters having different cut-off scales, an input to each successive filter being formed from an output of a previous filter;

b) subtracting a current filter output from the previous filter output for said succession of filters to obtain bandpass outputs, known as granularities, consisting of strings of data points which contain strings of zero-valued data points, known as zero segments, and strings of non-zero-valued data points, known as non-zero segments or granules;

c) selecting a subset of the granularities; and d) adding together granularities within said subset to produce an output signal containing the granules in said subset so as to preserve sharp signal edges in a smoothed signal.

* * * * *